(12) United States Patent
Mori et al.

(10) Patent No.: US 7,602,474 B2
(45) Date of Patent: Oct. 13, 2009

(54) EXPOSURE APPARATUS

(75) Inventors: Kenichiro Mori, Utsunomiya (JP);
Akihiro Yamada, Utsunomiya (JP);
Noboru Osaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 147 days.

(21) Appl. No.: 11/772,437

(22) Filed: Jul. 2, 2007

(65) Prior Publication Data
US 2008/0123055 A1 May 29, 2008

(30) Foreign Application Priority Data
Jul. 3, 2006 (JP) ............... 2006-183851

(51) Int. Cl.
*G03B 27/72* (2006.01)
*G03B 27/54* (2006.01)
(52) U.S. Cl. .......................... 355/71; 355/67
(58) Field of Classification Search .................. 355/53, 355/67–71; 356/399–401
See application file for complete search history.

(56) References Cited

U.S. PATENT DOCUMENTS

| | | | |
|---|---|---|---|
| 6,337,734 B1 | 1/2002 | Mori | 355/69 |
| 6,573,977 B1 | 6/2003 | Mori | 355/69 |
| 6,639,652 B1 | 10/2003 | Mori et al. | 355/67 |
| 6,803,991 B2 | 10/2004 | Mori | 355/53 |
| 6,903,801 B2 | 6/2005 | Mori | 355/67 |
| 7,245,355 B2* | 7/2007 | Mulkens et al. | 355/67 |
| 7,423,731 B2* | 9/2008 | Tanitsu et al. | 355/71 |

FOREIGN PATENT DOCUMENTS

| | | |
|---|---|---|
| JP | 2003-133216 | 5/2003 |
| JP | 2003-297729 | 10/2003 |
| WO | WO 2004/051717 | 6/2004 |

OTHER PUBLICATIONS

Born, et al., "Principles of Optics $7^{th}$", (Cambridge), pp. 31-33.

\* cited by examiner

*Primary Examiner*—Hung Henry Nguyen
(74) *Attorney, Agent, or Firm*—Fitzpatrick, Cella, Harper & Scinto

(57) ABSTRACT

An exposure apparatus which exposes a substrate to light. An illumination optical system illuminates a mask with illumination light, and a projection optical system projects a pattern of the mask onto the substrate. The illumination light contains a primary component of polarized light and a secondary component of the polarized light, which are perpendicular to each other, and the illumination optical system includes a phase difference adjusting unit configured to adjust a phase difference between the primary component of the polarized light and the secondary component of the polarized light, without changing a direction of the primary component of the polarized light.

3 Claims, 20 Drawing Sheets

ALLOWABLE PHASE DIFFERENCE RANGE WHEN BIREFRINGENCE OF PROJECTION OPTICAL SYSTEM IS 10 nm

ALLOWABLE PHASE DIFFERENCE RANGE WHEN RoP ON OBJECT SURFACE IS 0.92

F I G. 15
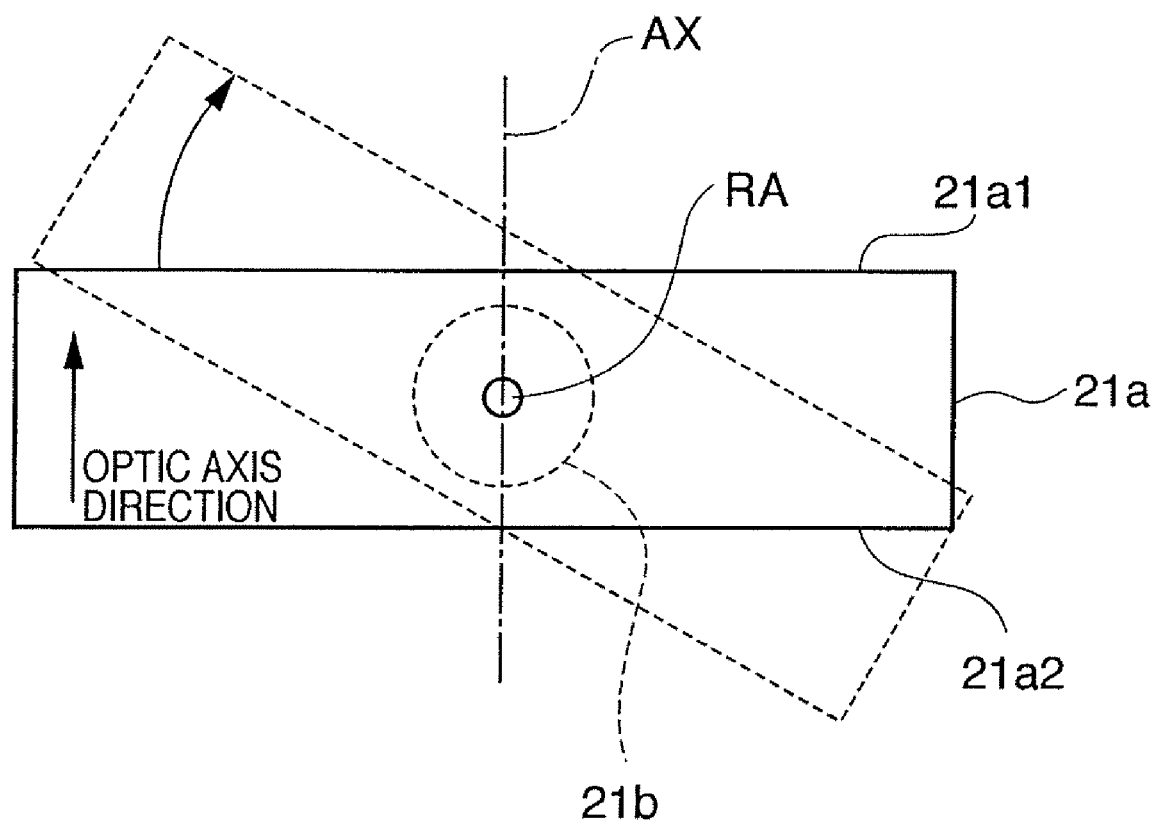

TILT ANGLE

EXPOSURE APPARATUS

This application clams the benefit of Japanese Patent Application No. 2006-183851, filed Jul. 30, 2006, which is hereby incorporated by reference herein in its entirety.

BACKGROUND OF THE INVENTION

1. Field of the Invention

The present invention relates to an exposure apparatus which exposes a substrate to light.

2. Description of the Related Art

Devices, such as semiconductor devices, can be manufactured using a lithography step. This lithography step uses a projection exposure apparatus, and includes a step of projecting a circuit pattern onto a substrate (e.g., a silicon substrate or a glass substrate), coated with a photosensitive agent, to transfer it onto the photosensitive agent.

In recent years, micropatterning of semiconductor device has advanced until a pattern having a line width of 0.15 μm or less is transferred onto a substrate. This advance has improved the degree of integration to be able to manufacture high-performance semiconductor devices with low power consumption. Under the circumstances, a strong demand has arisen for further micropatterning of semiconductor devices. This has triggered another strong demand for an improvement in the resolving power of the projection exposure apparatus.

To improve the resolving power of a projection exposure apparatus, there are available a method of increasing the NA of the projection optical system and a method of shortening the wavelength of exposure light. Nowadays, both methods are becoming more sophisticated.

In the 1990s, a projection optical system having an NA as high as about 0.6 was the mainstream. In recent years, a projection optical system having an NA more than 0.9 is under development. Furthermore, design of a projection optical system having an NA more than 1.0 and using an immersion exposure technique of immersing a substrate in a high-refraction liquid, such as water, is also in progress.

Shortening of the exposure wavelength is also in progress. The conventional light source uses a KrF excimer laser with light having a wavelength of 248 nm for exposure. However, the recent light source uses an ArF excimer laser with light having a wavelength of 193 nm and even an $F_2$ laser with light having a wavelength of 157 nm for exposure.

High-NA lithography requires consideration of a phenomenon in which P-polarized light decreases the contrast of interference fringes in the photosensitive agent. The P-polarized light is also called TM-polarized light, in which the electrical field vector of light, which strikes the surface of the substrate, lies on a plane including the light, and is normal to the substrate. The photosensitive agent is exposed in accordance with the electrical field strength of light. The electrical field vector of P-polarized light forms a uniform intensity distribution on the substrate, irrespective of the place, without generating any interference fringes. Hence, P-polarized light decreases the contrast of the interference fringes.

S-polarized light generates high-contrast interference fringes. The S-polarized light is also called TE-polarized light, in which the electrical field vector of light, which strikes the substrate, lies on a plane parallel to the substrate. Illuminating the mask only with S-polarized light makes it possible to attain good imaging performance.

In the coordinate system as shown in FIG. 2, two diffracted light beams $E_+$ and $E_-$ interfere with each other to form interference fringes. This specification assumes that the z direction is the optical axis direction and the z-axis is normal to the x-y plane. As the mirror bends the optical axis, the z direction is also bent. That is, in this specification, the x, y, and z directions are defined in a relative coordinate system using the optical axis direction as a reference.

Referring to FIG. 2, the electrical field vector of each of the diffracted light beams $E_+$ and $E_-$ contains S-polarized light (amplitude: Es) parallel to a substrate W and P-polarized light (amplitude: Ep) perpendicular to the S-polarized light.

The diffracted light beams $E_+$ and $E_-$ are expressed by:

$$E_+ = \begin{pmatrix} -Ep\cos\theta \\ Es \\ -Ep\sin\theta \end{pmatrix} e^{2\pi i\left(vt - \frac{z\cos\theta}{\lambda} + \frac{x\sin\theta}{\lambda}\right)} \quad (1)$$

$$E_- = \begin{pmatrix} -Ep\cos\theta \\ Es \\ Ep\sin\theta \end{pmatrix} e^{2\pi i\left(vt - \frac{z\cos\theta}{\lambda} + \frac{x\sin\theta}{\lambda}\right)} \quad (2)$$

where $v$ is the frequency, and $\lambda$ is the wavelength. For the sake of simplicity, the following description adopts linear polarization in the 45° direction in which S-polarized light is in phase with P-polarized light.

The sum of the diffracted light beams $E_+$ and $E_-$ is the amplitude of the interference fringes and is expressed by:

$$E_+ + E_- = \begin{pmatrix} -2Ep\cos\theta\cos\left(2\pi\frac{x\sin\theta}{\lambda}\right) \\ 2Es\cos\left(2\pi\frac{x\sin\theta}{\lambda}\right) \\ -2iEp\sin\theta\sin\left(2\pi\frac{x\sin\theta}{\lambda}\right) \end{pmatrix} e^{2\pi i\left(vt - \frac{z\cos\theta}{\lambda}\right)} \quad (3)$$

The square of the absolute value of this amplitude is the intensity of the interference fringes and is expressed by:

$$|E_+ + E_-|^2 = 4Ep^2\cos^2\theta\cos^2\left(2\pi\frac{x\sin\theta}{\lambda}\right) + \quad (4)$$
$$4Es^2\cos^2\left(2\pi\frac{x\sin\theta}{\lambda}\right) + 4Ep^2\sin^2\theta\sin^2\left(2\pi\frac{x\sin\theta}{\lambda}\right) =$$
$$4(Es^2 + Ep^2\cos2\theta)\cos^2\left(2\pi\frac{x\sin\theta}{\lambda}\right) + 4Ep^2\sin^2\theta$$

In equation (4), the term including the expression (5) represents the amplitude of oscillation of the interference fringes and yields a line-and-space intensity distribution having a cycle $\lambda/\sin\theta$ in the x direction.

$$\cos^2\left(2\pi\frac{x\sin\theta}{\lambda}\right) \quad (5)$$

When a micropattern is projected using a high-NA projection optical system, the angle θ formed by the diffracted lights increases. FIG. 3 shows the angle θ formed by the diffracted lights within the photosensitive agent (refractive index in the resist: 1.7) when, e.g., the projection optical system projects a line-and-space pattern having a cycle of L nm using an ArF having a wavelength λ of 193 nm. Using a binary mask (a mask light-shielded only by Cr) allows the angle θ formed by the diffracted lights to reach 45° at a cycle slightly less than about 160 nm. Using a Levenson phase shift mask (e.g., a mask also called an Alt-PSM, which not only shields light on itself, but also modulates its phase) allows the angle θ formed by the diffracted lights to reach 45° at a cycle slightly less than 80 nm.

As the angle θ becomes 45°, the value of cos 2θ in the coefficient of the term including the expression (5) becomes zero and, therefore, the term including the expression (5) becomes zero. For this reason, the amplitude Ep of the P-polarized light is not reflected in the term of the oscillation amplitude of the interference fringes, at all, but is reflected only in the term having $\sin^2 \theta$ not oscillated in the x direction. Hence, the P-polarized light merely decreases the contrast of the interference fringes.

The relationship between the diffracted light and the substrate determines whether the diffracted light contains a P-polarized light or an S-polarized light. That is, the above description applies to S- and P-polarized light when a pattern extends in the y direction and has a periodicity in the x direction. This means that the S-polarized light is a Y-polarized component whose electrical field vector is in the Y direction, while the P-polarized light is an X-polarized light whose electrical field vector is in the x-axis direction. To the contrary, a pattern which extends in the x direction and has a periodicity in the y direction generates diffracted light in the y direction. This means that the S-polarized light is an X-polarized light whose electrical field vector is in the x-axis direction, while the P-polarized light is a Y-polarized light perpendicular to the S-polarized light component. That is, an S-polarized light for a pattern having a cycle in the x direction corresponds to a P-polarized light for a pattern having a cycle in the y direction. Note that the polarization state changes depending on the surface serving as a reference and the direction in which the light beam strikes.

As described above, an exposure apparatus comprising a high-NA projection optical system allows a P-polarized light to decrease the image contrast. To obtain a high-contrast image, it is effective to perform exposure with exposure light having a low-intensity P-polarized light and a high-intensity S-polarized light. For this purpose, a polarization illumination system for illuminating the mask in a predetermined polarization state will become indispensable for high-NA lithography in the future.

FIG. 4 shows polarization states on the pupil plane of an illumination system implemented by the polarization illumination system. Y-polarization low-σ illumination using an Alt-PSM is effective in transferring a repetitive pattern in the x direction (σ: coherence factor). X-polarization low-σ illumination using an Alt-PSM is effective in transferring a repetitive pattern in the y direction. Y-polarization X-dipole illumination using a binary mask or a halftone mask (also called an Att-PSM) is effective in transferring a repetitive pattern in the x direction. X-polarization Y-dipole illumination using a binary mask or Att-PSM is effective in transferring a repetitive pattern in the y direction. Tangential-polarization crosspole illumination using a binary mask or Att-PSM is effective in transferring a mixture of repetitive patterns in both the x and y directions. Tangential-polarization zonal illumination using a binary mask or Att-PSM is effective in transferring a mixture of repetitive patterns in various directions. The tangential polarization is polarization in which an electrical field vector is in a direction almost perpendicular to the center direction of the optical axis at each point within the pupil of the illumination system. Radial-polarization 45° quadrupole illumination using a Cr-less PSM is effective in transferring a contact hole pattern. The radial-polarization is polarization in which an electrical field vector is in the center direction of the optical axis at each point within the pupil of the illumination system.

FIG. 5 is a view showing an arrangement of a projection exposure apparatus comprising a polarization illumination optical system. Also, PCT Publication No. WO 2004/051717 discloses an example of a projection exposure apparatus of this type.

A light source 1 uses, e.g., an excimer laser. The excimer laser can include, e.g., a KrF excimer laser (wavelength: 248 nm), an ArF excimer laser (wavelength: 193 nm), or an $F_2$ laser (wavelength: 157 nm).

A flat plate 2 spatially separates the light source 1 and the exposure apparatus. The light source 1 and the exposure apparatus require different degrees of cleanliness of their internal spaces. The flat plate 2 spatially separates and individually purges them.

To adjust the illuminance on the illumination target surface, an attenuating filter 3 incorporates a switchable multi-stage attenuating filter.

The light source 1 and projection exposure apparatus are sometimes separately placed on different floors. For this reason, floor vibration may asynchronously act on the light source 1 and projection exposure apparatus to result in constant shifts and inclinations of the optical axis between them. A microlens array (or cylindrical microlens array; to be called an MLA hereinafter) 4 functions as a so-called fly-eye lens of a field type. Even when the optical axis of light which strikes the MLA 4 inclines, it guides light with a predetermined angular distribution in which the optical axis of the MLA 4 serves as a center. Hence, even when floor vibration, or the like, inclines the optical axis, light with a predetermined angular distribution is applied to the projection exposure apparatus.

The light which emerges from the MLA 4 is reflected inside an internal reflecting member 5 to be able to obtain an almost uniform distribution at the exit of the internal reflecting member 5. The internal reflecting member 5 is an internal reflection type integrator, which is also called an optical rod. As the internal reflecting member 5 makes the distribution uniform, the light which emerges from the internal reflecting member 5 becomes uniform even when a shift of the optical path occurs between the light source and the projection exposure apparatus. A combination of the above-described MLA and internal reflecting member allows the exit surface of the internal reflecting member to capture light that has a predetermined angular distribution and is uniform with respect to the optical axis of the projection exposure apparatus, even when a shift or inclination of the optical axis occurs between the light source and the projection exposure apparatus.

Optical elements 61 and 62 are diffractive optical elements, such as a computer generated hologram (to be called a CGH hereinafter) or refractive optical elements, such an MLA. The optical elements 61 and 62 can be selectively inserted in the optical path.

A first condenser lens 7 forms Fourier images of the optical elements (CGHs or MLAs) 61 and 62 at a position A. The circular MLA forms an almost uniform, circular illuminance distribution at the position A. The CGH can form a Fourier-transformed image having an arbitrary shape. Using the CGH as the optical elements 61 and 62 makes it possible to form zonal, quadrupole-shaped, and dipole-shaped images.

A variable magnification relay optical system 8 projects the light intensity distribution (CGH Fourier image) at the position A, with various magnifications onto the incident surface of a fly-eye lens 10.

A phase plate 9 changes the polarization state of light applied from the light source 1. A case in which the light from the light source 1 is polarized light having an electrical field vector in a direction perpendicular to the sheet surface will be exemplified. To illuminate the surface of a mask 15 with polarized light having an electrical field vector in a direction perpendicular to the sheet surface, the phase plate 9 is removed from the optical path to maintain the degree of polarization at the light source. On the other hand, to illuminate the mask 15 with polarized light having an electrical field vector in a direction parallel to the sheet surface, a $\lambda/2$-phase plate 9 having a fast axis in the 45° direction with respect to a direction perpendicular to the sheet surface is inserted in the optical path. This rotates the direction of the electrical field vector of the light from the light source 1 through 90° to illuminate the mask surface with polarized light having an electrical field vector in a direction parallel to the sheet surface.

The fly-eye lens 10 forms a plurality of secondary sources at the pupil position of the illumination optical system. A microlens array or cylindrical microlens array, for example, may substitute for the fly-eye lens 10.

A second condenser II forms an almost uniform light distribution by superimposing the light beams from the secondary sources at a position B. A variable aperture stop (not shown) for controlling the illumination region of the illumination target surface is arranged at the position B. A relay optical system 14 projects the light distribution at the position B onto the mask 15 on which a pattern is drawn.

A projection optical system 16 projects the pattern drawn on the mask 15 onto a substrate (wafer) 17 coated with a photosensitive agent. The projection optical system 16 normally reduces the pattern of the mask 15 to one-quarter, and projects it onto the substrate 17. A substrate stage (wafer stage) 19 moves the substrate 17 step by step to transfer the patterns onto the substrate 17 a plurality of number of times. In a projection exposure apparatus of a scanning exposure type, the substrate stage 19 scans the substrate 17 in synchronism with the mask 15.

There are two exposure schemes, i.e., cell projection and scanning exposure schemes. The cell projection exposure scheme fixes the substrate and the pattern of the mask at conjugate positions and exposes the photosensitive agent until its exposure amount reaches optimum. The scanning exposure scheme partially illuminates the pattern of the mask, projects the partial pattern of the mask onto the substrate by exposure for every moment, and synchronously scans the mask and substrate to transfer the entire region of the pattern onto the substrate by exposure. In this case, sync scanning must be performed such that the exposure amount on the photosensitive agent reaches optimum, while each pattern portion is transferred by exposure.

An exposure amount control technique of the cell projection exposure scheme may adopt, e.g., a method of monitoring the exposure amount on the substrate so that the light source ends light emission or the shutter ends exposure when the exposure amount on the substrate has reached a desired one.

An exposure amount control technique of the scanning exposure scheme may adopt constant-illuminance control for controlling the illuminance to be constant. In this method, while keeping the scanning speeds of the substrate and mask constant, an illumination region is exposed with an illuminance under which the exposure amount reaches a desired one at its passage timing. This technique may also adopt a method of changing the scanning speed in synchronism with a change in illuminance. Examples of the constant-illuminance control are a method of controlling the oscillation frequency of the light source 1 and a method of controlling a voltage applied to the light source 1. Japanese Patent Laid-Open No. 2003-133216, for example, discloses an exposure amount control method of the scanning exposure scheme.

Either method requires exposure amount control by monitoring the exposure amount during exposure for the substrate. Hence, the projection exposure apparatus incorporates an exposure amount sensor for monitoring the exposure amount during exposure by dividing the exposure light.

A half mirror 12 divides exposure light and sets the divided light at the position of an exposure amount sensor 13, that is, almost conjugate to the position B. The exposure amount sensor 13 monitors the exposure amount in parallel with exposure for the substrate. An illuminometer 18 measures the illuminance on the surface of the substrate 17.

The relationship between the output from the exposure amount sensor 13 and the illuminance on the substrate 17 may change depending on, e.g., a change in the transmittance of the projection optical system 16. To cope with this problem, the illuminometer 18 is periodically inserted in the optical path to obtain information indicating a relationship between the output from the illuminometer 18 and the output from the exposure amount monitor 13. An exposure amount control unit 20 saves this information. During exposure, the output from the exposure amount monitor 13 is sent to the exposure amount control unit 20 to calculate the exposure amount on the substrate on the basis of the information. Exposure amount control is performed on the basis of the calculated exposure amount in accordance with the above-described exposure amount control technique.

The above-described prior art sets a desired polarization state of laser light using a phase plate. There is a proposal for attaining linear polarization using a linear polarizer. The linear polarizer transmits only predetermined linearly polarized light. An example of the linear polarizer is introduced as a sheet polarizer on page 76 of "How to Use Optical Components and Points to Be Noted for Optronics Application: Enlarged and Revised Edition" (author: Tetsuo Sueda) edited by Optronics Co., Ltd.

A lens of a projection optical system exhibits birefringence, which degrades the imaging performance. The lens of the projection optical system is made of a glass material, such as quartz, which does not have birefringence inherently. However, such a glass material acquires a slight amount of birefringence upon a stress strain due to temperature non-uniformity in solidifying the molten glass material or a processing strain in lens processing. FIG. 6 schematically shows the birefringence distribution in the lens. The color density represents the birefringence amount, and arrows each represent the direction of a fast axis. Birefringence is a phenomenon in which different refractive indices act on two perpendicular polarized light components. The difference between distances by which the wavefronts of the two perpendicular polarized light components have moved after transmission through the lens will be called a birefringence amount (unit: nm). The direction in which the wavefront of the polarized light moves will be called a fast axis. As shown in FIG. 6, the birefringence distribution exhibits a tendency that the birefringence amount increases and the fast axis inclines to the radiation direction towards the periphery of the lens.

Birefringence occurs in the projection optical system due to an antireflection coating or a reflection coating, in addition to the above-described factors.

As described above, a projection optical system suffers from a pupil birefringence distribution that is too serious to neglect in manufacture. Such a pupil birefringence distribution is unique to each image height. FIG. 7 schematically shows a projection optical system. The mask and substrate are in an imaging relationship in which a solid line indicates a light beam (on-axis light beam), which forms an image at the on-axis image height, and a broken line indicates a light beam (off-axis light beam), which forms an image at the off-axis image height. For the sake of simplicity, first and second lenses 16a and 16b represent the lens group of the projection optical system 16. The on-axis light beam passes through a region 1a of the first lens 16a and a region 2a of the second lens 16b. The off-axis light beam passes through a region 1b of the first lens 16a and a region 2b of the second lens 16b. Since the lens birefringence distribution is non-uniform, as shown in FIG. 6 described above, different amounts of birefringence act on the on-axis and off-axis light beams. In addition, different amounts of birefringence act on even the same on-axis light beam, depending on its passage position on the lens. This makes even the pupil birefringence distribution non-uniform.

Two birefringence effects of the projection optical system 16 cause degradation in imaging performance. The first effect is that a phase difference occurs on the substrate because the optical path length changes for each polarized light component. This causes a wavefront aberration between the polarized light components to result in degradation in imaging performance. The second effect is that birefringence in the projection optical system decreases the degree of polarization on the substrate even when increasing the degree of polarization on the mask, which results in degradation in imaging performance. The former can be suppressed, in the polarized light illumination using only specific polarized light as indicated by the upper stage of FIG. 4, by driving an aberration correction mechanism to correct the wavefront aberration of the specific polarized light. However, in the illumination without polarization or when polarized light components in various directions, as indicated by the lower stage of FIG. 4, exist, the aberration between the polarized light components remains not corrected completely even by driving the aberration correction mechanism. Note that the inventors of this invention found that degradation in imaging performance under the illumination without polarization or when polarized light components in various directions is less than that due to the first effect, that decreases the degree of polarization on the substrate.

A change in transfer line width (a change in CD (Critical Dimension)) due to a change in the degree of polarization will be explained with reference to FIG. 8. The degree of polarization is defined as the ratio of the light amount of the primary component of polarized light to the total light amount, i.e., as the RoP (Ratio of Polarized light intensity). The primary component of polarized light is a necessary polarized light component, as indicated by an arrow in FIG. 4. An unnecessary polarized light component that is perpendicular to the primary component of the polarized light is the secondary component of the polarized light. If the RoP is 1, the polarized light contains primary components alone. If the RoP is 0.5, the ratio of the primary component of the polarized light to the secondary component of the polarized light is 1:1. FIG. 8 shows the line width of a transfer pattern as a function of a change in RoP on the substrate. An exposure condition is that the NA of the projection optical system is 1.35, the coherence factor σ is 0.20, and the mask is a Levenson phase shift mask. In this case, the transfer line width is 45 nm, and a plurality of lines is obtained by changing the space between the lines. The exposure amount is set such that the line width reaches a desired one when the RoP is 1. Referring to FIG. 8, the line width of a transfer pattern which is indicated by "45/45", i.e., whose "line:space" is 1:1, does not change from 45 nm even by changing the RoP. However, when "line:space" shifts from 1:1, the line width of the transfer pattern changes depending on a change in RoP. Especially, a transfer pattern which is indicated by "45/180" (space: 180 nm), i.e., whose "line: space" is 1:4, exhibits high line width changes sensitivity to a change in the degree of polarization. In this case, if the RoP decreases by 0.2, the line width changes by about 2 nm.

A change in the line width of a transfer pattern changes the electrical characteristic of a transistor in a semiconductor device manufactured using the projection exposure apparatus. Especially, a variation in the electrical characteristic of the transistor in the chip inhibits, e.g., signal synchronization. This may produce a defective chip. To prevent this problem, in particular, a strict demand is arising for minimization of a line width variation in the transfer area. The allowable line width variation (CD uniformity) of a transfer pattern having a line width of 45 nm is about 1 nm. The CD uniformity suffers also by other factors, such as the aberration difference between image heights, and the difference in exposure amount between image heights. In view of this, the allowable amount of line width error due to the difference in the degree of polarization between image heights is about 0.2 nm. Consequently, the difference in RoP between image heights must be about 0.02 (i.e., 2%). The prior art suffers from a decrease in CD uniformity, because the RoP changes between image heights as the birefringence amount of the projection optical system changes between image heights.

Japanese Patent Laid-Open No. 2003-297729 discloses a method of correcting the birefringence of a projection optical system by providing in the projection optical system, a phase correction member for correcting a phase difference that occurs in the projection optical system. The arrangement described in Japanese Patent Laid-Open No. 2003-297729 can correct a component that is uniform both between image heights and in the pupil. As described above, however, it is impossible to correct a birefringence whose distribution is non-uniform, i.e., changes for each image height in the lens. Since this arrangement cannot correct the difference in the degree of polarization between image heights, it is unsuitable for measuring against a decrease in CD uniformity. This arrangement is also not practical because the imaging performance may degrade upon placing a uniaxial birefringent crystal in the projection optical system.

SUMMARY OF THE INVENTION

It is an object of the present invention, e.g., to reduce the difference in the degree of polarization between image heights, which occurs on a substrate due to birefringence of a projection optical system.

According to the present invention, there is provided an exposure apparatus which exposes a substrate to light. The exposure apparatus comprises an illumination optical system, which illuminates a mask with illumination light, and a projection optical system, which projects the pattern of the mask onto the substrate. The illumination light contains the primary component of polarized light and the secondary component of the polarized light, which are perpendicular to each other. The illumination optical system includes a phase difference adjusting unit configured to adjust the phase difference between the primary component of the polarized light and the secondary component of the polarized light without changing the direction of the primary component of the polarized light.

According to the present invention, it is possible, e.g., to reduce the difference in the degree of polarization between image heights, which occurs on a substrate due to birefringence of a projection optical system.

Further features of the present invention will become apparent from the following description of exemplary embodiments (with reference to the attached drawings).

BRIEF DESCRIPTION OF THE DRAWINGS

FIG. 15 is a view showing a schematic arrangement of a phase difference adjusting unit according to the first embodiment of the present invention;

DESCRIPTION OF THE EMBODIMENTS

An exposure apparatus according to the present invention can be used in a lithography step of manufacturing a device, such as a semiconductor device, a liquid crystal display device, an image sensing device (e.g., CCD), or a thin-film magnetic head.

The exposure apparatus comprises an illumination optical system for illuminating, with light applied from a light source, a mask (reticle) on which a pattern is formed, and a projection optical system for transferring the pattern of the mask onto a substrate coated with a photosensitive agent (resist).

Although the present invention is especially suitable for an exposure apparatus, which comprises a projection optical system having an NA of 0.9 or more and causes an illumination optical system to illuminate a mask in a specific polarization state, it is not limited to this.

The inventors of this invention focused attention on the fact that the amount of decrease in the degree of polarization on the substrate due to birefringence of the projection optical system changes depending on the phase difference between two perpendicular components of polarized light, which strikes the projection optical system. A preferred embodiment of the present invention to be described hereinafter control the phase difference between two perpendicular components of polarized light, which strikes the projection optical system. This reduces the difference in the degree of polarization on the substrate between image heights to improve the CD uniformity on the substrate.

Figure 9:
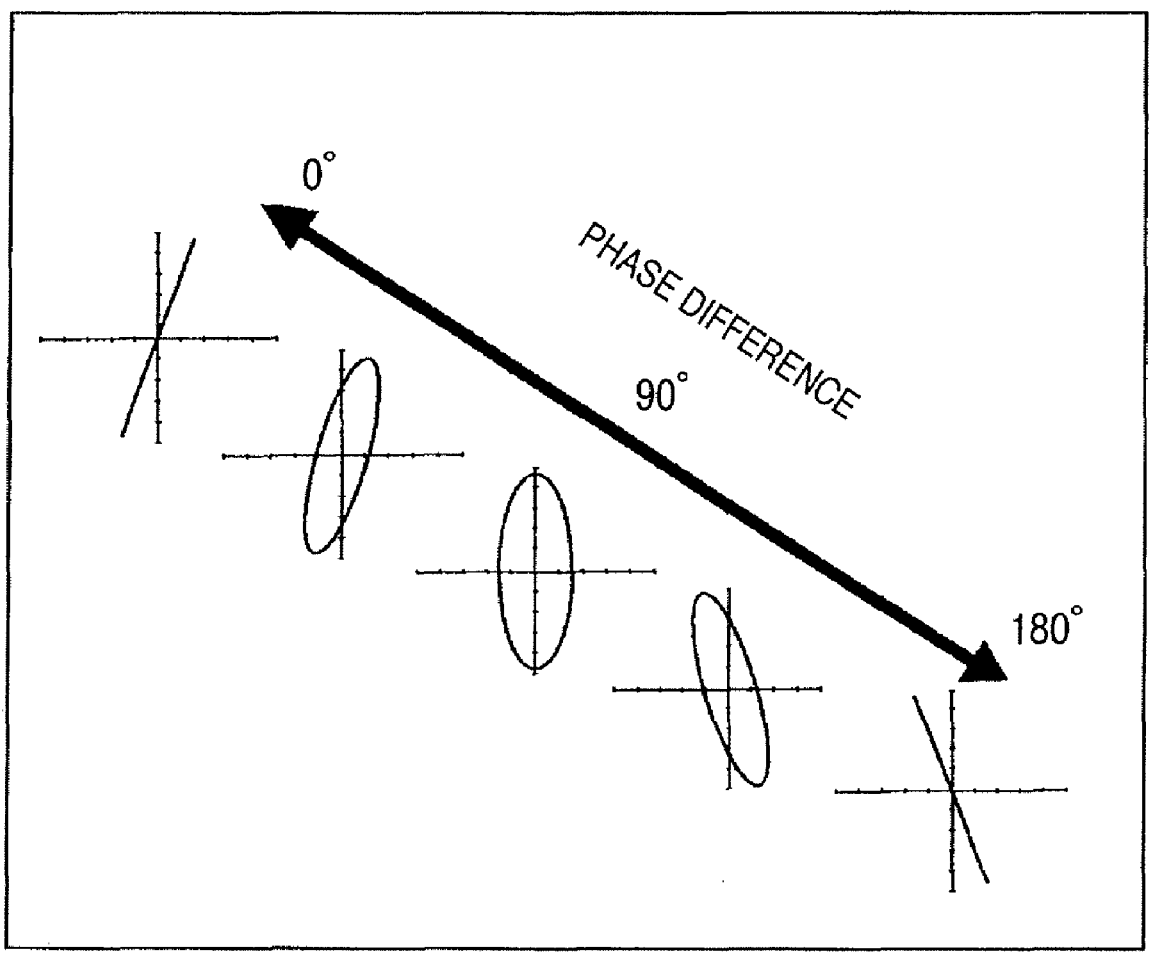
FIG. 9 is a view showing the relationship between the phase difference and the polarization state.

Referring to FIG. 9, if certain light beams exhibit the same RoP, they are equal in the intensity ratio of the primary component (a polarized light in the vertical direction on the sheet surface of FIG. 9) of polarized light to the secondary component (a polarized light component in the horizontal direction on the sheet surface of FIG. 9) of the polarized light. As described above, the RoP is the ratio of the primary component of polarized light to the total light amount. Letting Im be the light amount of the primary component of polarized light, and Is be the light amount of the secondary component of the polarized light, the RoP is Im/(Im+Is). As shown in FIG. 9, even if certain light beams exhibit the same RoP, they differ in polarization state, depending on the phase difference between the primary component of polarized light and the secondary component of the polarized light. For example, if the phase difference between the primary component of polarized light and the secondary component of the polarized light is 0°, the light in question is linearly polarized light, as indicated by the left end in FIG. 9. When the phase difference is 90°, the light in question is circularly polarized light, as indicated by the middle in FIG. 9.

The inventors of this invention found that even if certain light beams undergo birefringence of the same projection optical system, they differ in the degree of polarization on the substrate, depending on the phase difference between two perpendicular components of polarized light, which strikes the projection optical system. That is, even if certain light beams exhibit the same RoP on the object plane of the projection optical system, they differ in RoP on the substrate depending on the phase difference.

Details of this phenomenon will be explained below. Assume that the primary component of polarized light is an X-polarized light component, and the secondary component of the polarized light is a Y-polarized light component. Using the RoP on the object plane of the projection optical system, stokes parameters of light are expressed by:

$$S_{in} = \begin{pmatrix} 1 \\ 2 \times RoP - 1 \\ 2\cos\phi\sqrt{RoP - RoP^2} \\ 2\cos\phi\sqrt{RoP - RoP^2} \end{pmatrix} \quad (6)$$

where φ is the phase difference between the X- and Y-polarized light components.

The Mueller matrix of a projection optical system having a fast axis in the direction of an angle γ with respect to the X direction is expressed by:

$$M = \begin{pmatrix} 1 & 0 & 0 & 0 \\ 0 & \cos^2 2\gamma + \sin^2 2\gamma \cos\theta & \cos 2\gamma \sin 2\gamma(1-\cos\theta) & -\sin 2\gamma \sin\theta \\ 0 & \cos 2\gamma \sin 2\gamma(1-\cos\theta) & \sin^2 2\gamma + \cos^2 2\gamma \cos\theta & \cos 2\gamma \sin\theta \\ 0 & \sin 2\gamma \sin\theta & -\cos 2\gamma \sin\theta & \cos\theta \end{pmatrix} \quad (7)$$

where θ is the retardation amount.

For the sake of simplicity, assuming that the fast axis lies in the 45° direction with respect to the X direction, the Mueller matrix becomes:

$$M = \begin{pmatrix} 1 & 0 & 0 & 0 \\ 0 & \cos\theta & 0 & -\sin\theta \\ 0 & 0 & 1 & 0 \\ \theta & \sin\theta & 0 & \cos\theta \end{pmatrix} \quad (8)$$

The polarization state after transmission through the projection optical system can be calculated M×S given by:

$$S_{out} = \begin{pmatrix} 1 \\ (2RoP-1)\cos\theta - 2\sin\theta\sin\phi\sqrt{RoP-RoP^2} \\ 2\cos\phi\sqrt{RoP-RoP^2} \\ (2RoP-1)\sin\theta - 2\cos\theta\sin\phi\sqrt{RoP-RoP^2} \end{pmatrix}. \quad (9)$$

The RoP can be calculated by $(S_0+S_1)/(2\times S_0)$ using the stokes parameters. From equation (9), the RoP on the substrate (to be referred to as RoPw) after transmission through a projection optical system having a fast axis in the 45° direction with respect to the X direction is given by:

$$RoPw = \frac{1 + (2RoP-1)\cos\theta - 2\sin\theta\sin\phi\sqrt{RoP-RoP^2}}{2} \quad (10)$$

where θ is the retardation amount, RoP is the RoP on the mask, and φ the phase difference.

Figure 10:
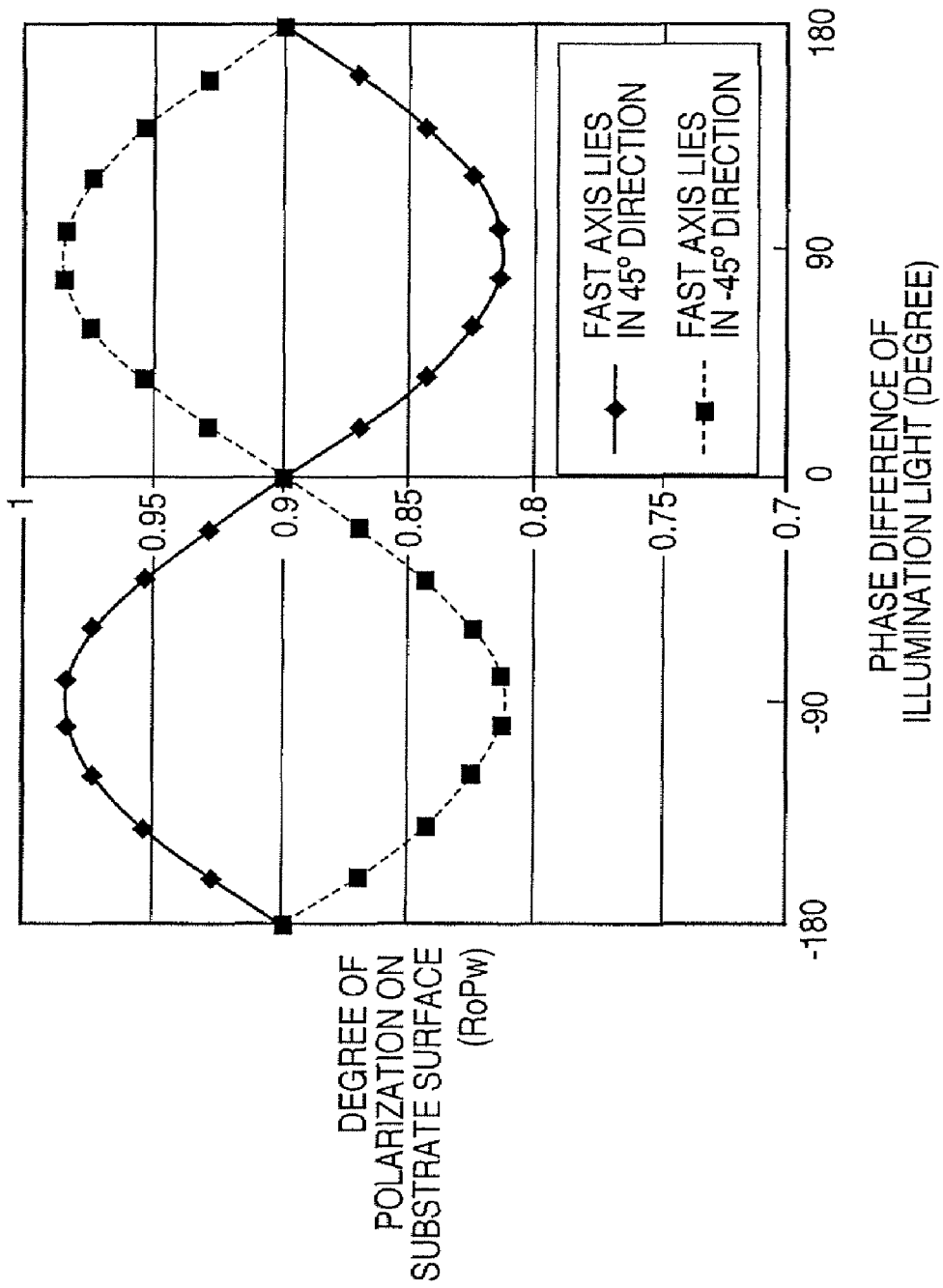
FIG. 10 is a graph for explaining that the degree of polarization on a substrate changes depending on the phase difference on the object plane of the projection optical system.

FIG. 10 shows the dependency of the RoP on the substrate upon the phase difference on the object plane of the projection optical system, which is calculated by equation (10) when the RoP on the object plane of the projection optical system is 0.92, the birefringence of the projection optical system is 10 nm, and the exposure wavelength is 193 nm. The light which strikes the object plane desirably exhibits an RoP of 1, which does not have the secondary component of polarized light. However, the RoP on the object plane may decrease to about 0.92 due to a polarization control error and birefringence of the glass material used for the illumination optical system. (The illumination optical system is generally made of a glass material having a birefringence higher than that of the projection optical system from the viewpoint of cost. Naturally, the object plane suffers from the difference in the degree of polarization between image heights.)

Assume that a wavefront having an electrical field vector in the direction of the fast axis of birefringence of a projection optical system and a wavefront having an electrical field vector in the direction of the slow axis enter the projection optical system. When the birefringence of the projection optical system is 10 nm, the two wavefronts, after transmission through the projection optical system, have a difference of 10 nm. This difference amounts to a phase difference of 10/193× 360=18.7° since the wavelength is 193 nm. This phase difference is called a retardation. That is, FIG. 10 shows a result obtained by calculating equation (10) when θ is 18.7°.

The abscissa of FIG. 10 represents the phase difference between the X- and Y-polarized light components of light which strikes the projection optical system. The ordinate of FIG. 10 represents the RoP on the substrate (RoPw). The solid line indicates a case in which the direction of the fast axis of birefringence of the projection optical system lies in the 45° direction with respect to the X-axis. The broken line indicates a case in which the direction of the fast axis lies in the −45° direction.

As is obvious from FIG. 10, even when the RoP on the object plane of the projection optical system is 0.92, irrespective of the phase difference between the X- and Y-polarized light, the RoP on the substrate (RoPw) may change from 0.98 to 0.81 due to this phase difference. Also, obviously, the RoP on the substrate (RoPw) as a function of the phase difference depends on the direction of the fast axis of birefringence. The fast axis of a glass material is likely to incline relative to the radiation direction, as described above. This means that the fast axis of birefringence of the projection optical system inclines to a direction unique to each image height/pupil. For example, if the phase difference is 90°, the light beam having passed through a given route exhibits an RoPw of 0.81, while the light beam having passed through another route exhibits an RoPw of 0.98. That is, even if the RoP on the object plane of the projection optical system does not change between image heights, the direction of the fast axis of birefringence of the projection optical system changes depending on the image height. This may result in a large difference in RoP on the substrate between image heights.

Birefringence of the projection optical system can yield fast axes of birefringence in various directions. To prevent the RoP on the substrate from changing between image heights, it is desirable to adjust the phase difference of light which strikes the mask to a phase difference (i.e., 0° or its neighborhood) at which the RoP on the substrate does not change, even when the direction of the fast axis changes in FIG. 10.

The reason why the phase difference of light, which strikes the mask influences on the degree of polarization on the substrate, will be explained. It is possible to describe the polarization state using stokes parameters. A Poincaré sphere facilitates understanding of the stokes parameters. An example of the stokes parameters and Poincaré sphere is explained by Max Born and Emil Wolf, Principles of Optics 7$^{th}$ (expanded) edition (CAMBRIDGE), pp. 31-33.

Figure 11:
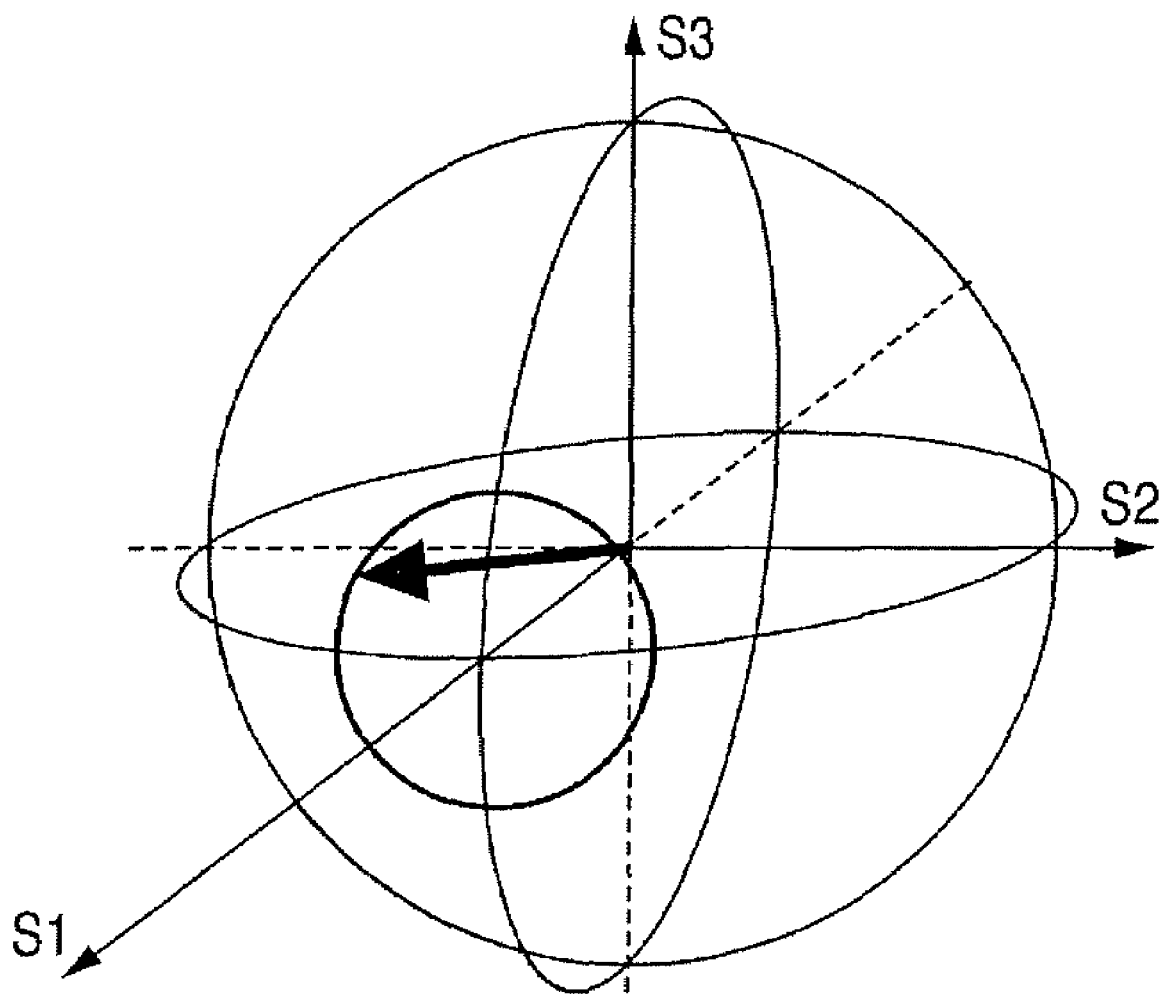
FIG. 11 is a view representing an iso-RoP line on a Poincaré sphere.
Figure 12:
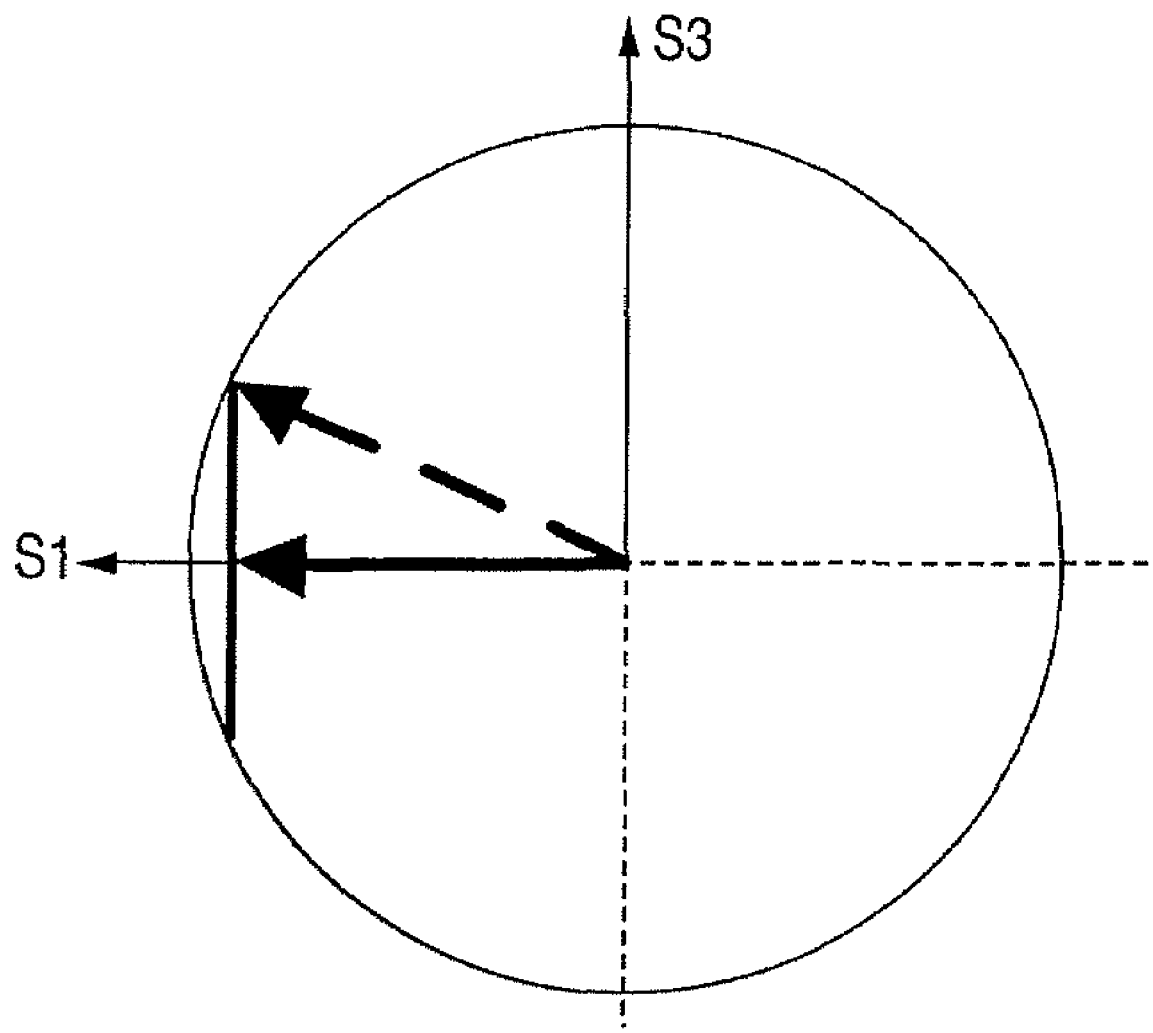
FIG. 12 is a projection view when the Poincaré sphere shown in FIG. 11 is seen from the S2 direction.

FIG. 11 is a view representing the same RoPs using a Poincaré sphere. Since the X-polarized light component is a desired polarized light component, the RoP is expressed using stokes parameters as RoP=$(S_0+S_1)/(2S_0)$, and a polarized light phase difference φ is expressed by tan φ=$S_3/S_2$. The bold line on the Poincaré sphere shown in FIG. 11 indicates a polarization state of the same RoP. When the phase difference is 0° and 180°, the bold line crosses a plane $S_1$-$S_2$. When the phase difference is 90° and 270°, the bold line crosses a plane $S_1$-$S_3$. FIG. 12 is a view showing the Poincaré sphere as seen from the $S_2$-axis. Referring to FIG. 12, the solid line indicates a polarization state when the phase difference is 0°, and the broken line indicates that when the phase difference is 90°.

When the light passes through a birefringent member having a fast axis in the 45° direction, the polarization state on the Poincaré sphere rotates about the $S_2$-axis as a center. Assuming, for example, that the birefringence is 10 nm, as described above, the polarization state rotates about the $S_2$-axis as a center through $10/193 \times 360 = 18.7°$. When the Poincaré sphere in this state is seen from the $S_2$-axis, as in FIG. 12, if the phase difference is 0°, the thin solid line indicates a polarization state before passage through the birefringent member, and the bold solid line indicates a polarization state after this passage. Similarly, if the phase difference is 90°, the thin broken line indicates a polarization state before passage through the birefringent member, and the bold broken line indicates a polarization state after passage through the birefringent member.

Figure 13:
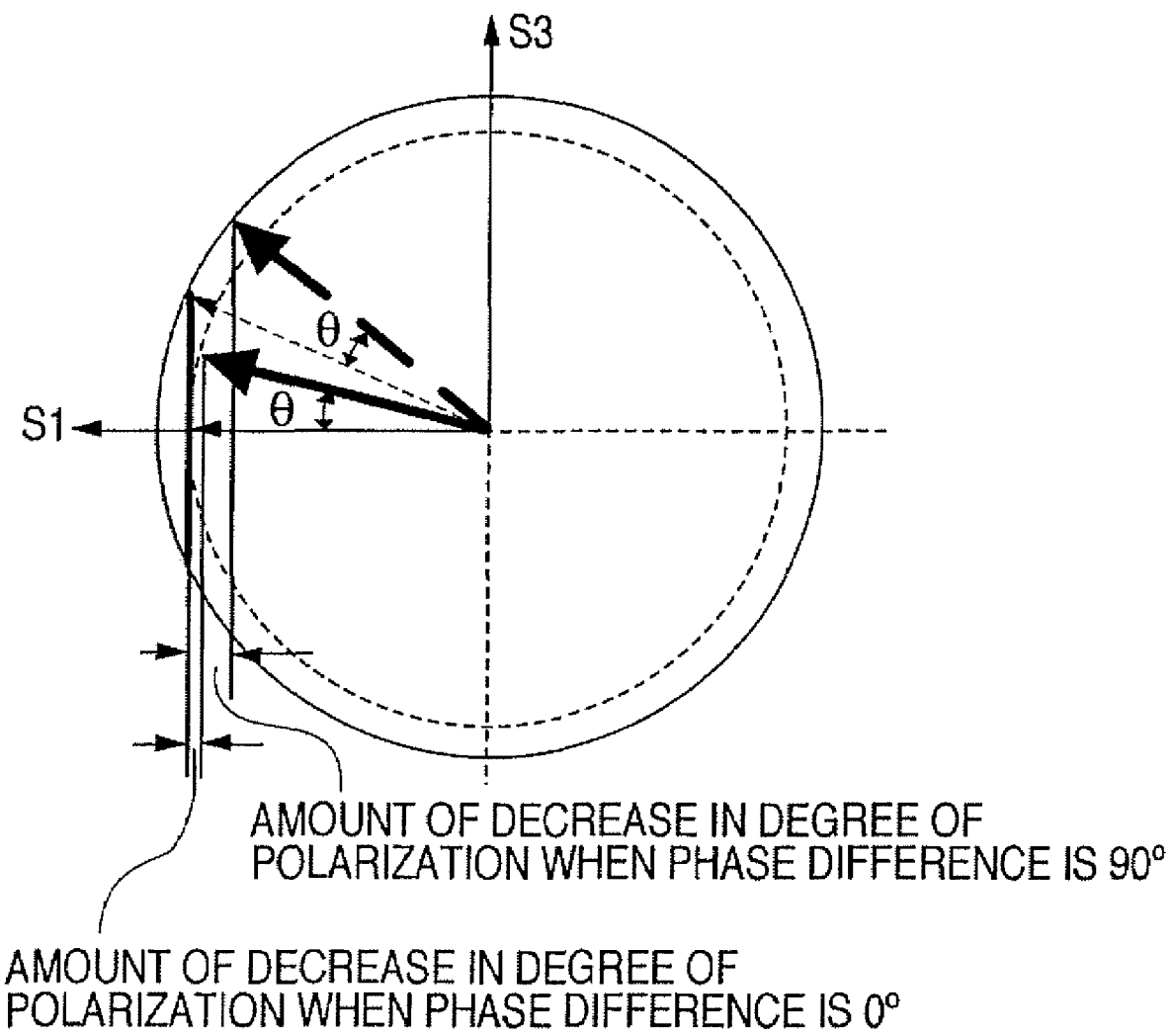
FIG. 13 is a view for explaining, using the Poincaré sphere, that the phase difference on the object plane of the projection optical system influences the degree of polarization on the substrate.

As described above, the RoP can be calculated by RoP= $(S_0+S_1)/(2S_0)$ and is, therefore, proportional to the length of projection onto the $S_1$-axis. As is obvious from FIG. 13, the amount of decrease in the degree of polarization when the phase difference is 90° is larger. To the contrary, when the birefringence is −10 nm (the state in which the fast axis inclines to the −45° direction), the degree of polarization improves if the phase difference is 90°. However, as described above, the fast axis and amount of birefringence of the projection optical system are non-uniform between image heights, and, therefore, take various directions and values. Hence, it is effective to minimize the influence of birefringence of the projection optical system, in order to reduce the non-uniformity of the degree of polarization on the substrate.

For this purpose, according to the preferred embodiment of the present invention, the illumination optical system incorporates a phase difference adjusting unit. The phase difference adjusting unit has a function of continuously adjusting the phase difference between the primary and secondary components of polarized light as illumination light which illuminates a mask, without changing the direction of the primary component of the polarized light. The phase difference adjusting unit can decrease, to 0° or its neighborhood, the phase difference between the primary and secondary components of polarized light as illumination light which illuminates a mask, without changing the direction of the primary component of the polarized light. Illuminating the mask while decreasing the phase difference between the primary and secondary components of polarized light without changing the direction of the primary component reduces the difference in the degree of polarization on the substrate between image heights. This makes it possible to improve the CD uniformity.

As described above, it is desirable to adjust the difference in RoP on the substrate between image heights to 0.02 or less. When the fast axis of the projection optical system inclines in the x and y directions, the RoP on the substrate becomes equal to that on the object plane of the projection optical system. In contrast, when the fast axis inclines in the ±45° direction, a change in RoP becomes maximum. To adjust the difference in RoP due to a variation in the direction of the fast axis between image heights to 0.02 or less, it suffices to satisfy:

$$\left| \frac{1 + (2RoP - 1)\cos\theta - 2\sin\theta\sin\phi\sqrt{RoP - RoP^2}}{2} - RoP \right| \le 0.02. \quad (11)$$

Since the projection optical system is made of a glass material having low birefringence, its retardation takes a small value. When $\cos\theta \approx 1$, inequality (11) simplifies into:

$$\left| \sin\theta\sin\phi\sqrt{RoP - RoP^2} \right| \le 0.02. \quad (12)$$

From inequality (12), to adjust the difference in RoP between image heights to 0.02 or less, it suffices that a phase difference φ between two perpendicular polarized light components on the object plane of the projection optical system satisfies:

$$|\sin\theta| \le \frac{0.02}{\left| \sin\theta\sqrt{RoP - RoP^2} \right|}.$$

Figure 14A:
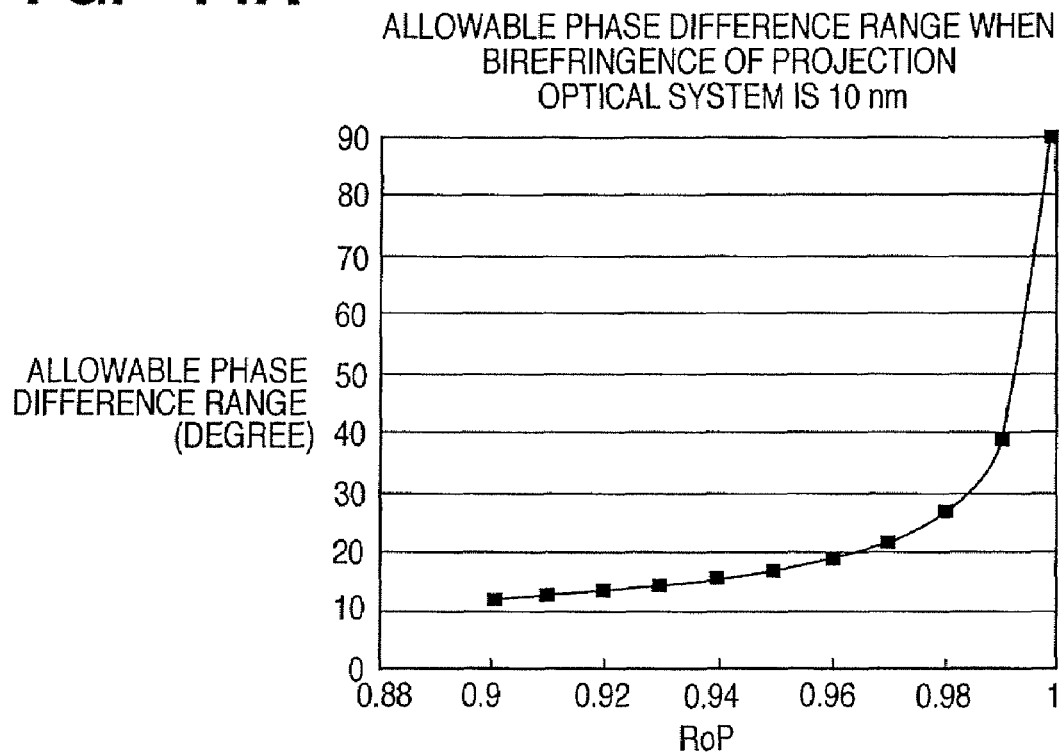
FIGS. 14A and 14B are graphs each illustrating the allowable phase difference value under a specific condition.
Figure 14B:
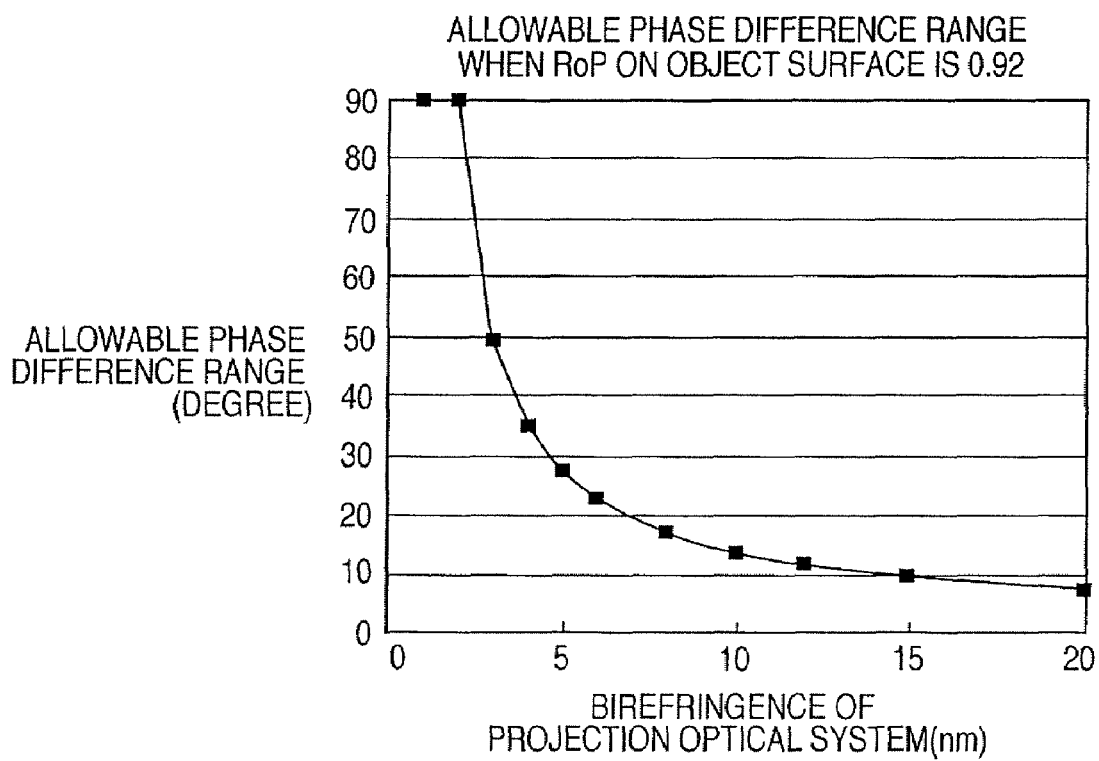

FIGS. 14A and 14B are graphs each showing the result of calculation of the allowable phase difference range on the object plane of the projection optical system under a corresponding condition in accordance with inequality (13). FIG. 14A shows the RoP on the object plane and the allowable amount of the phase difference on the object plane when the birefringence of the projection optical system is 10 nm. For example, if the RoP on the object plane is 0.95, it suffices to adjust the phase difference on the object plate to fall within ±18°. However, when the RoP on the object plane decreases to 0.90, the phase difference must be adjusted to fall within ±11°. FIG. 14B shows the birefringence amount of the projection optical system and the allowable amount of the phase difference on the object plane when the RoP on the object plane is 0.92. If the birefringence of the projection optical system is 10 nm, the phase difference on the object plane must be suppressed to fall within ±12°. However, when the birefringence of the projection optical system can be reduced to 5 nm, it suffices to suppress the phase difference on the object plane to fall within the range of ±28°.

Figure 1:
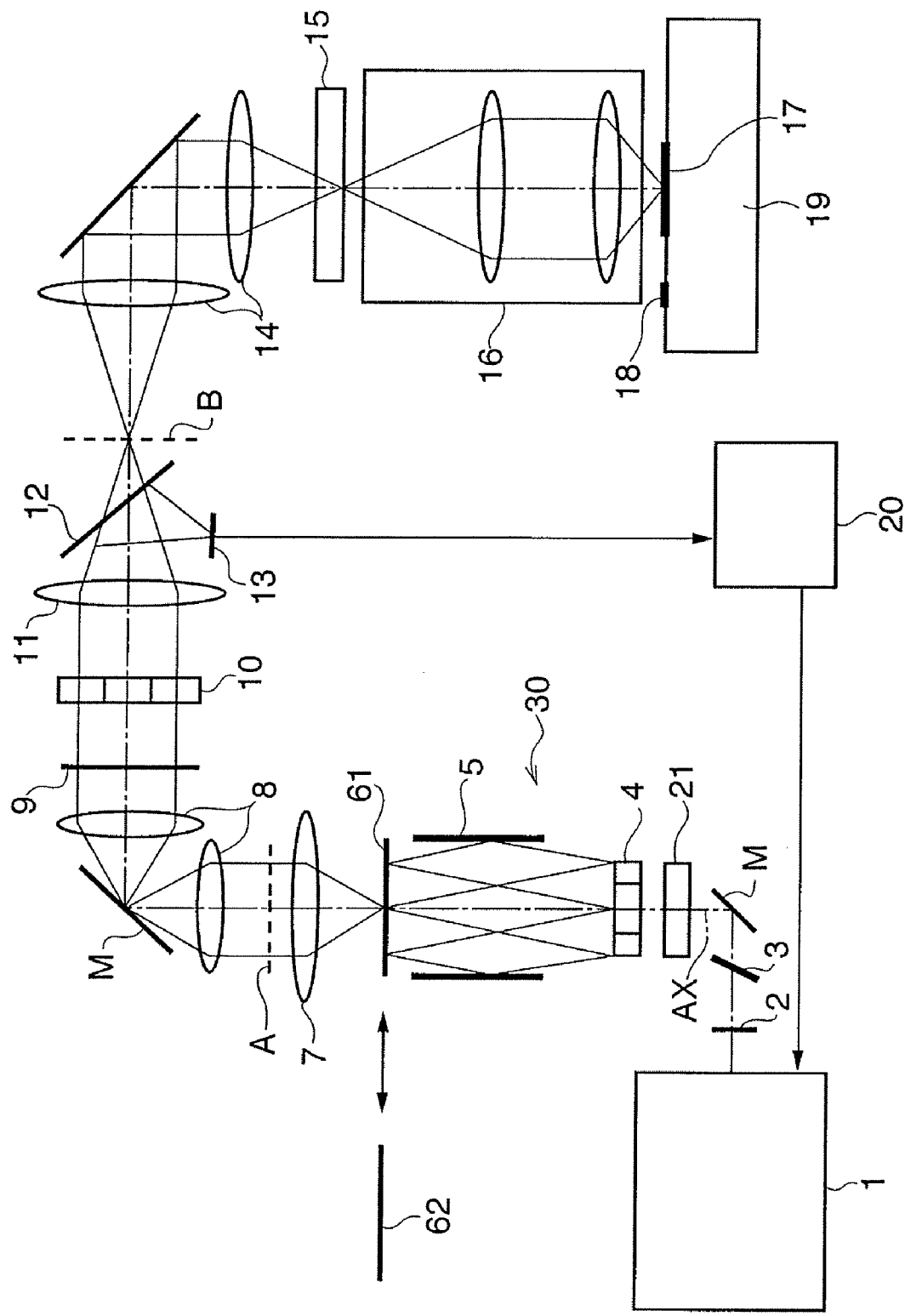
FIG. 1 is a view showing a schematic arrangement of an exposure apparatus according to a preferred embodiment of the present invention.
Figure 2:
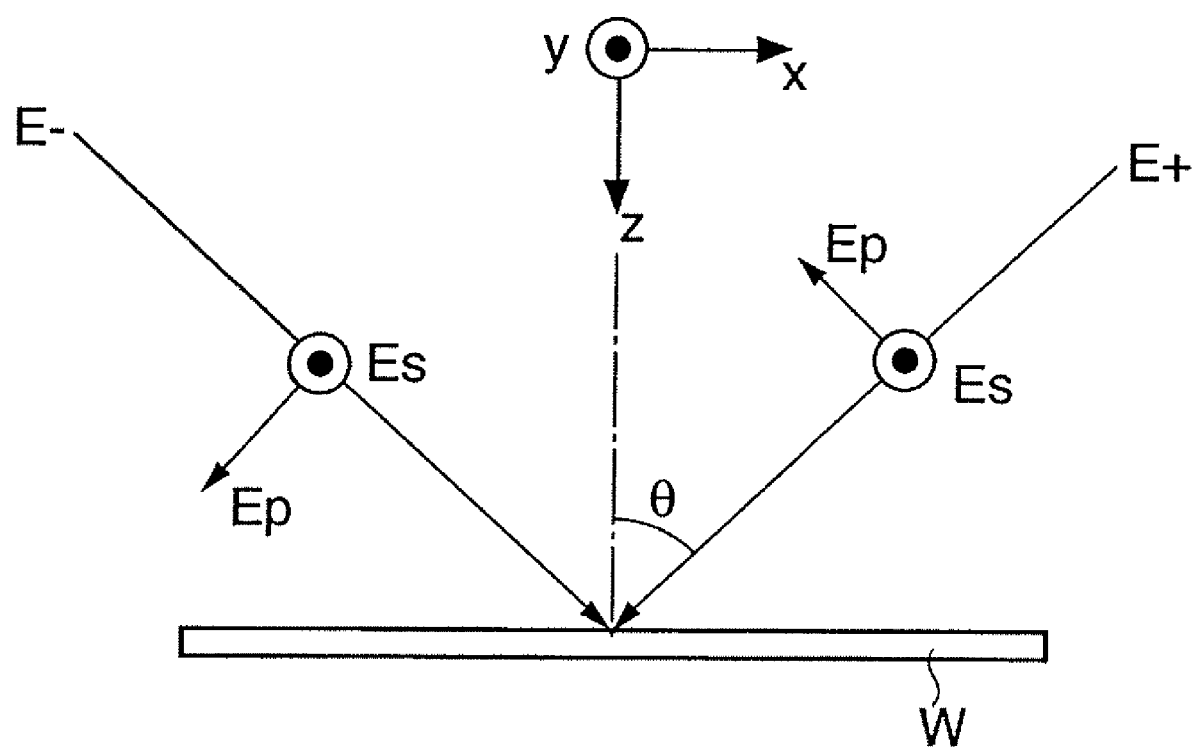
FIG. 2 is a view for explaining the image contrast in high NA.
Figure 3:
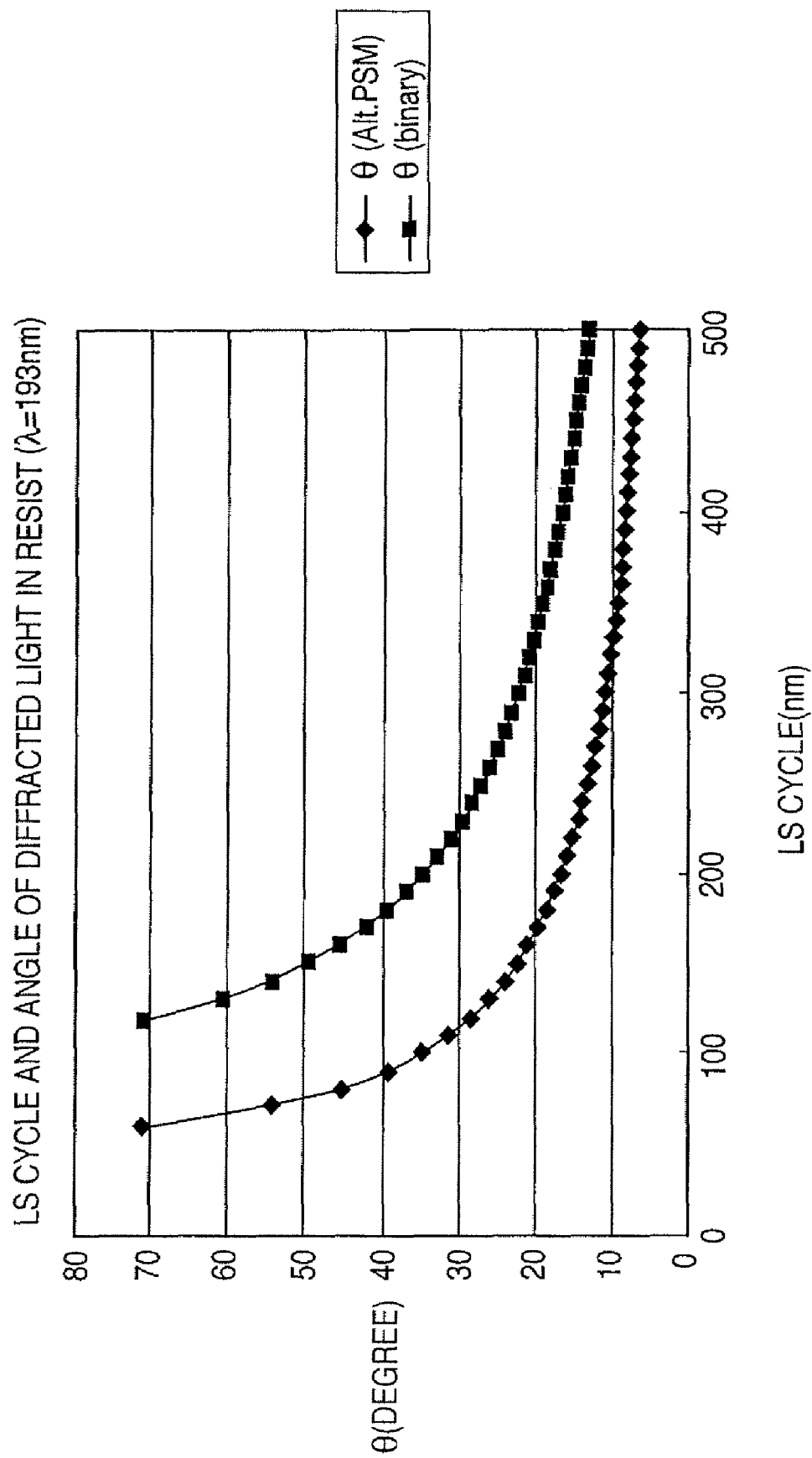
FIG. 3 is a graph showing the line-and-space cycle and the angle formed by diffracted lights within the resist.
Figure 4:
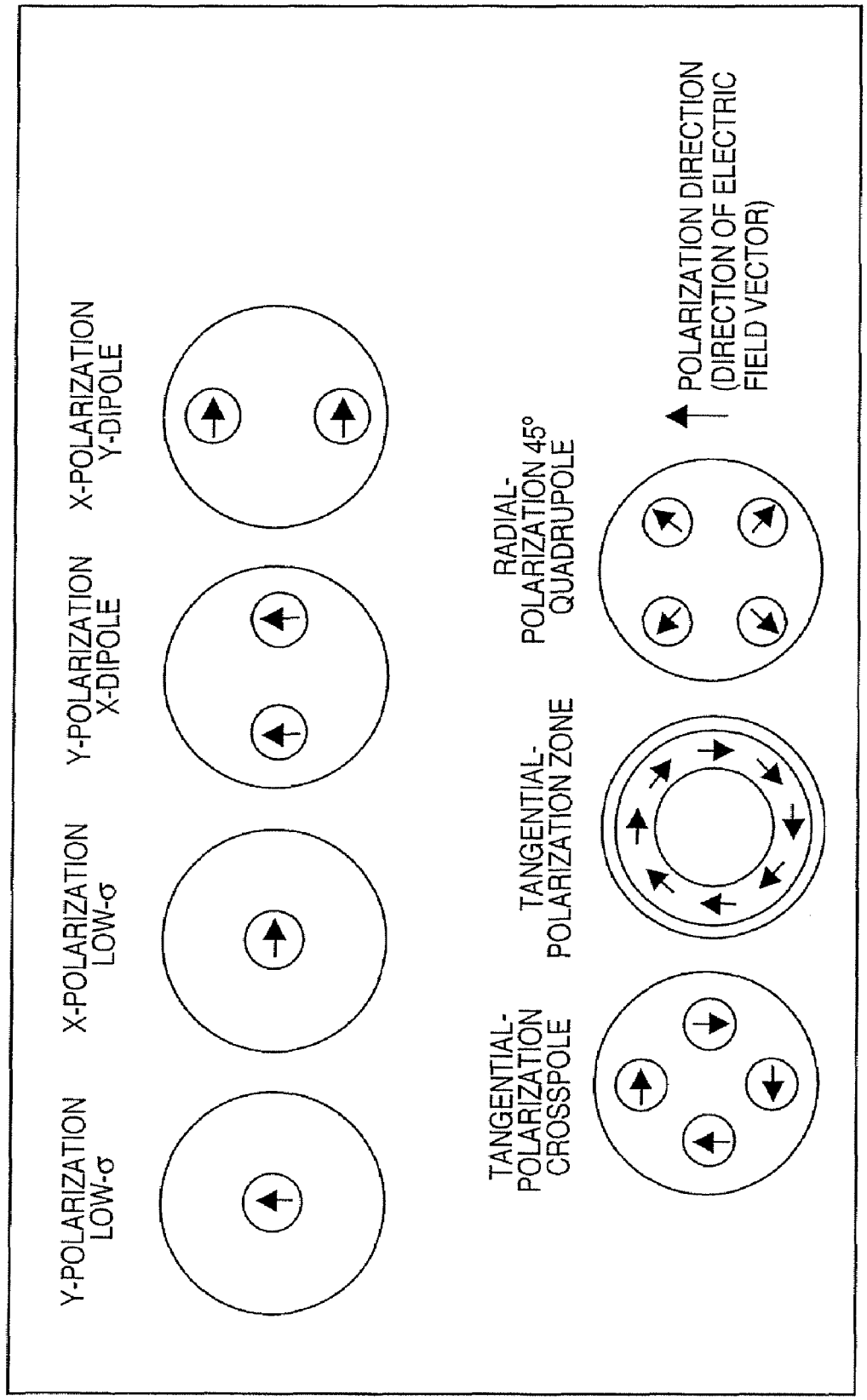
FIG. 4 is a view for explaining a polarization state on the pupil of an illumination optical system in polarization illumination.
Figure 5:
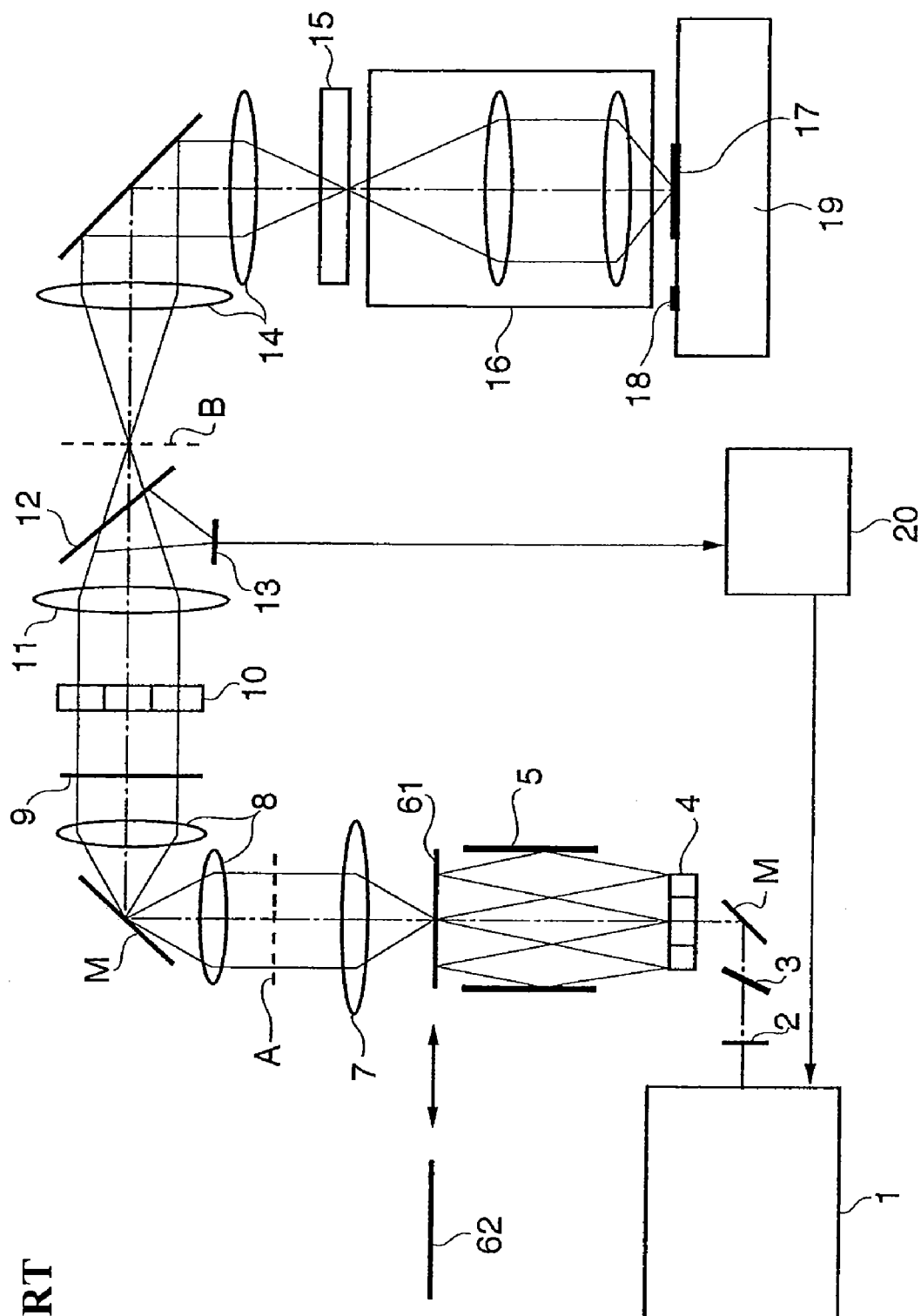
FIG. 5 is a view showing an arrangement of an exposure apparatus.
Figure 6:
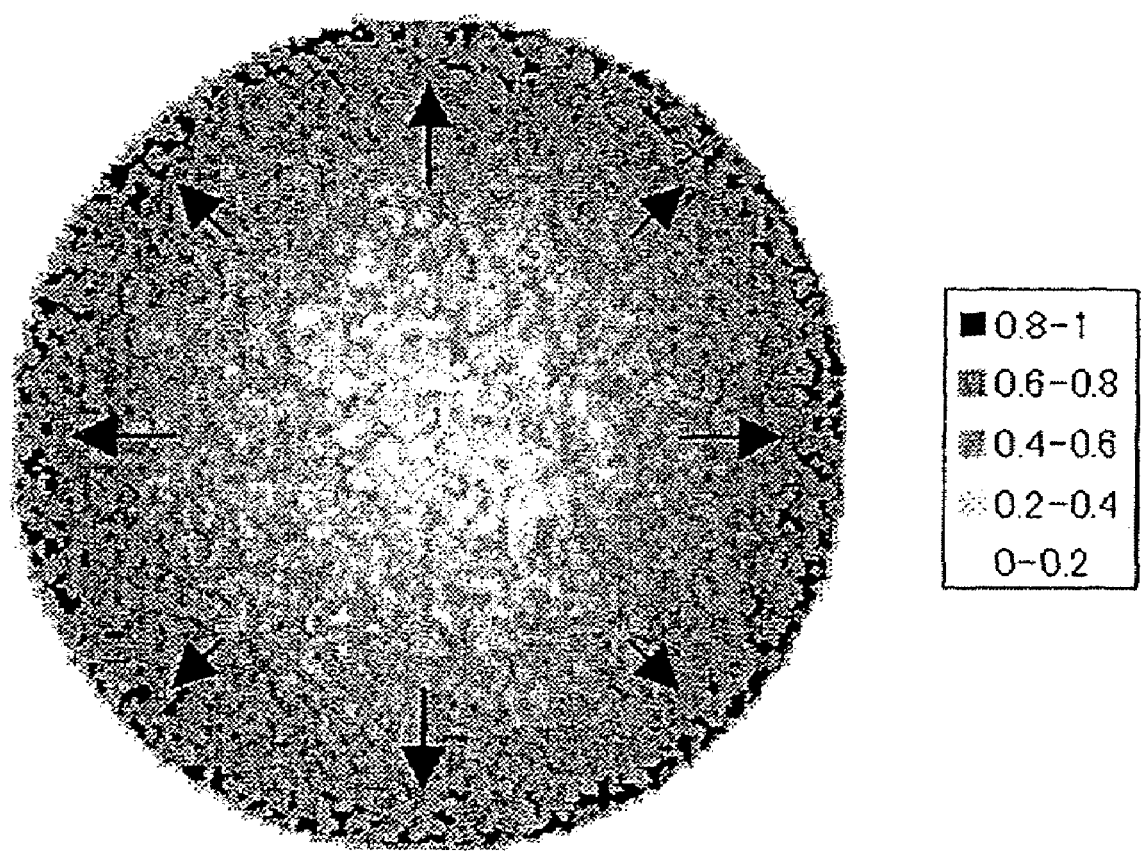
FIG. 6 is a view showing an example of birefringence of a glass material.
Figure 7:
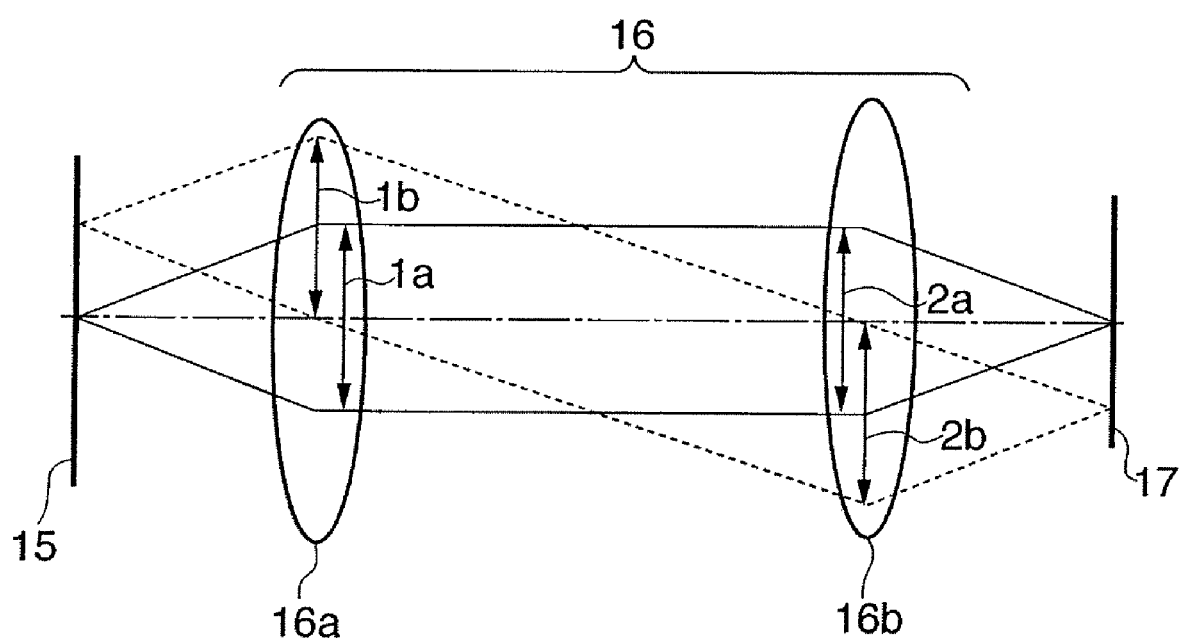
FIG. 7 is a view for explaining that the birefringence amount of a projection optical system changes between image heights.
Figure 8:
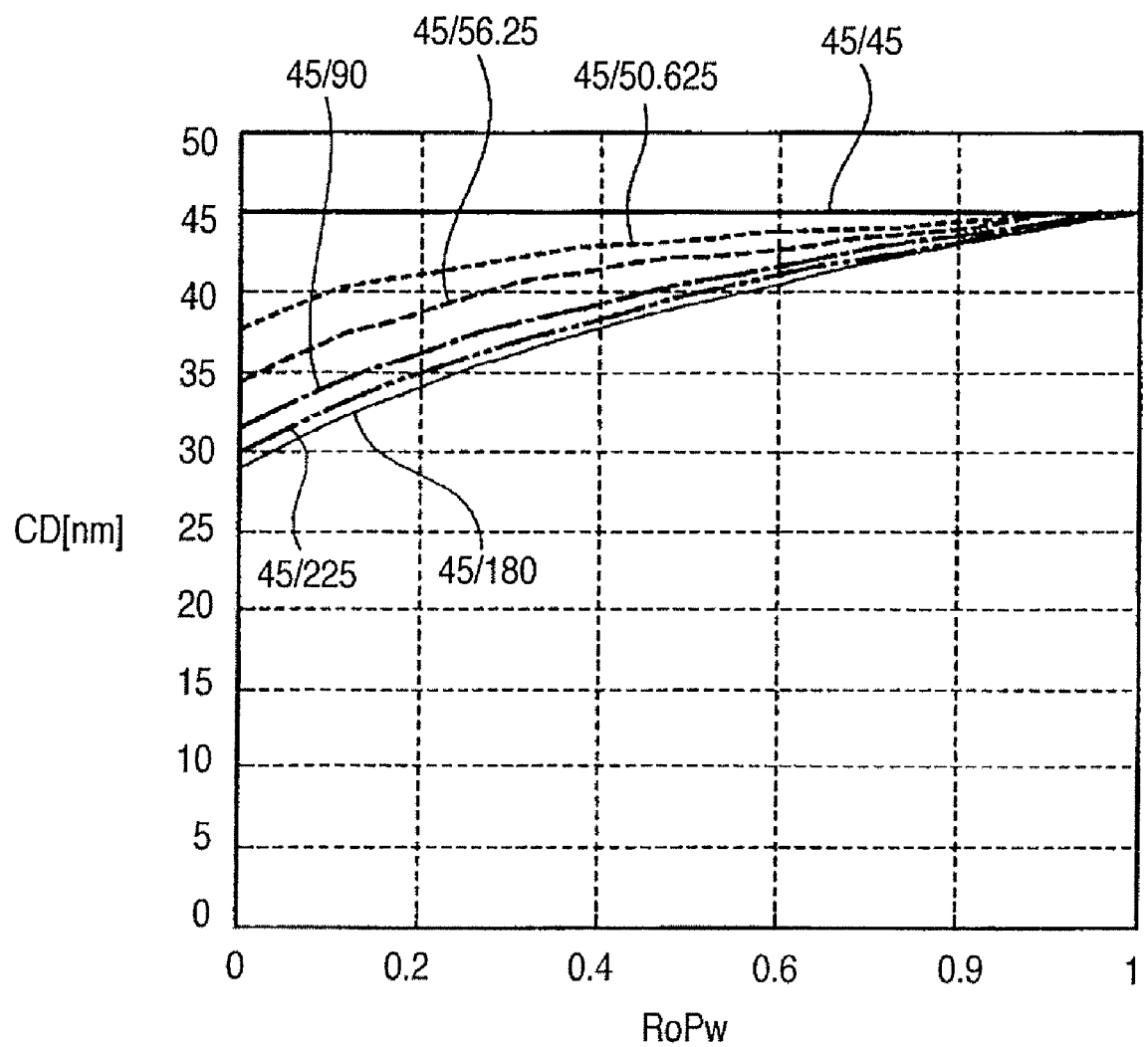
FIG. 8 is a graph for explaining changes in RoP and CD.

FIG. 1 is a view showing a schematic arrangement of an exposure apparatus according to a preferred embodiment of the present invention. The same references numerals as those in FIG. 5 denote the same constituent components in FIG. 1, and a description thereof will not be repeated.

An illumination optical system 30 for illuminating a mask 15 with light applied from a light source 1 comprises a phase difference adjusting unit 21. The phase difference adjusting unit 21 has a function of continuously adjusting the phase difference between the primary and secondary components of polarized light as illumination light which illuminates the mask, without changing the direction of the primary component of the polarized light.

Light emitted by the light source (laser) 1 has a high degree of polarization because its polarization direction inclines in a specific direction. However, due to an error of the optical system inside the light source 1, the light emitted by the light source 1 contains a slight amount of secondary components of the polarized light, whose polarization directions incline in a direction perpendicular to the polarization direction of the primary component of the polarized light to be emitted naturally. The phase difference between the primary and secondary components of the polarized light may take any value. This is because light having a high degree of polarization is light which almost inclines to the $S_1$-axis on the above-described Poincaré sphere. The light which almost inclines to the $S_1$-axis can fall toward both the $S_2$- and $S_3$-axis directions in accordance with the direction of the fast axis of a slight amount of birefringence, if the slight amount of birefringence exists. For this reason, it is possible that the phase difference represented as arctan $(S_3/S_2)$ occurs as any values in accordance with the fast axis direction, even if the birefringence is a slight amount that cannot be measured.

The illumination optical system 30, which is folded and accommodated in a small space, requires a reflecting mirror. The reflecting mirror generates a reflection phase difference between the P- and S-polarized light components, so a phase difference occurs between two perpendicular polarized light components (the primary and secondary components of polarized light) in the illumination optical system 30.

In this way, a phase difference occurs between two perpendicular polarized light components (the primary and secondary components of polarized light) in the light source 1 and illumination optical system 30. To cope with this problem, the phase difference adjusting unit 21 adjusts the phase difference between the two perpendicular polarized light components at the position of the mask 15 (the object plane of the projection optical system) to fall within the allowable value.

In the following description, the phase difference adjusting unit adjusts the phase difference between a polarized light component having an electrical field vector in a direction parallel to the sheet surface and a polarized light component having an electrical field vector in a direction perpendicular to the sheet surface.

FIG. 15 is a view showing a schematic arrangement of a phase difference adjusting unit 21 according to the first embodiment of the present invention. The phase difference adjusting unit 21 can include a phase difference adjusting plate 21a and an actuator (rotation driving mechanism) 21b for rotating the phase difference adjusting plate 21a about a rotation axis RA (e.g., an axis that is perpendicular or parallel to the sheet surface of FIG. 1) perpendicular to an optical axis AX. The phase difference adjusting plate 21a is a flat plate. In other words, the phase difference adjusting plate 21a has a first surface 21a1 and a second surface 21a2 that are almost parallel to each other. One of the first surface 21a1 and the second surface 21a2 is a surface which the light strikes and the other is a surface from which the light emerges. The tilt of the second surface 21a2 with respect to the first surface 21a1 preferably falls within 2 arcmin. The phase difference adjusting plate 21a can have, e.g., a disk-like or rectangular shape. The phase difference adjusting plate 21a includes, e.g., a uniaxial crystal, such as quartz or magnesium fluoride. The optical axis of the uniaxial crystal inclines to the normal to the first surface 21a1 or the second surface 21a2.

Figure 16:
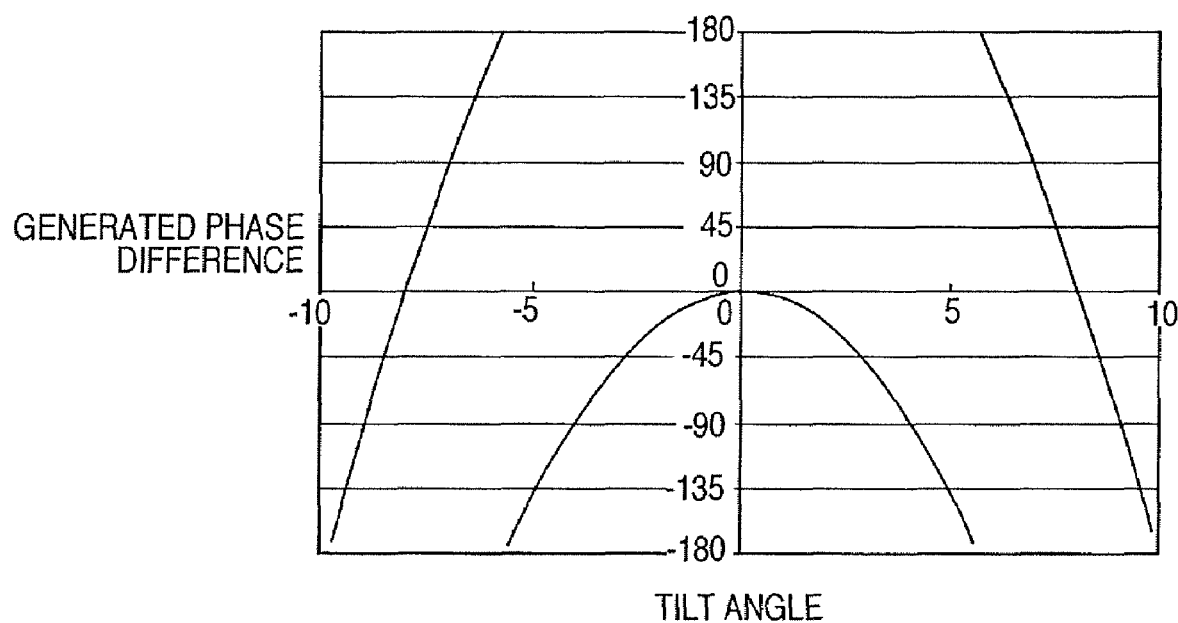
FIG. 16 is a graph for explaining the effect of the phase difference adjusting unit according to the first embodiment of the present invention.

FIG. 16 is a graph showing the generation amount of the phase difference when a 2-mm thick flat phase difference adjusting plate 21a made of magnesium fluoride is used. The abscissa of FIG. 16 indicates the tilt angle (the angle of the first surface 21a1 with respect to a plane perpendicular to the optical axis AX) of the phase difference adjusting plate (phase difference adjusting element) 21a. The ordinate of FIG. 16 indicates a phase difference which occurs between a polarized light component having an electrical field vector in a direction parallel to the sheet surface and a polarized light component having an electrical field vector in a direction perpendicular to the sheet surface. Since the phase difference has a cycle of 360°, it is expressed by an angle in the range of ±180°. When the phase difference adjusting plate 21a inclines, the phase difference between the two perpendicular polarized light components gradually increases. As the plate 21a inclines by about 5°, the phase difference reaches 180°. As the plate 21a inclines by 8°, the phase difference can take an arbitrary angle in the range of ±180°.

If the phase difference adjusting plate 21a, made of a uniaxial crystal, is thick, it is possible to generate a phase difference of ±180° with a very narrow tilt angle. However, the resolution of the actuator 21b must be raised when the plate 21a is too thick. If the phase difference adjusting plate 21a is thin, the driving accuracy by the actuator 21b may be rough, but a wide tilt angle is necessary. Hence, 2 mm, as described above, is suitable as the thickness of the phase difference adjusting plate 21a to facilitate its mounting.

As the phase difference adjusting plate 21a inclines, the optical axis slightly shifts. Even though this shift amount is normally negligible, if it becomes problematic, it suffices to insert another parallel flat plate in the optical path and to synchronously incline it so as to correct the shift in the optical axis.

In this way, adjusting the tilt amount of the phase difference adjusting plate 21a made of a uniaxial crystal makes it possible to adjust the phase difference between two perpendicular polarized light components on the object plane of the projection optical system.

Figure 17:
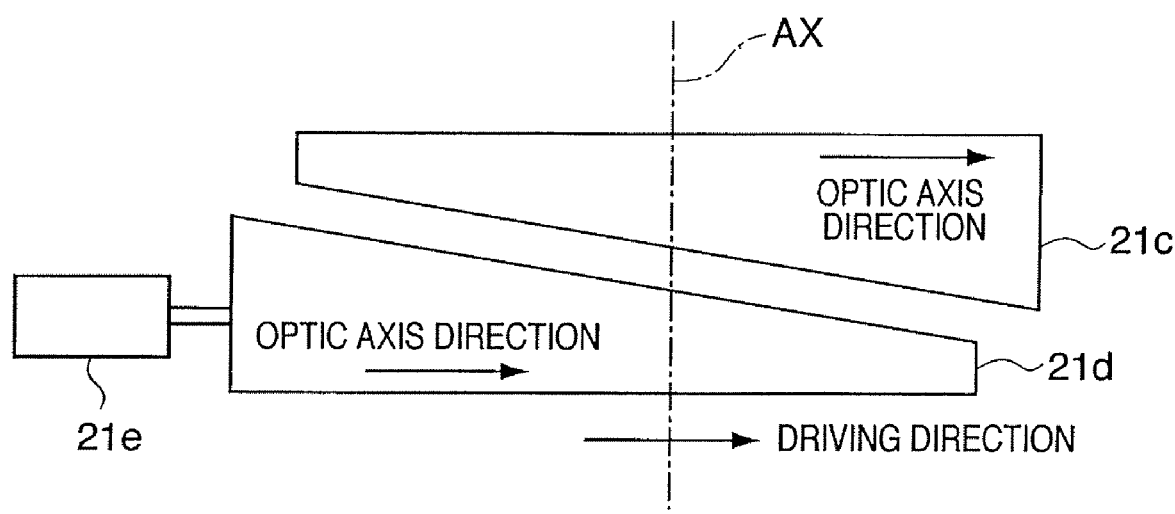
FIG. 17 is a view showing a schematic arrangement of a phase difference adjusting unit according to the second embodiment of the present invention.

FIG. 17 is a view schematically showing an arrangement of a phase difference adjusting unit 21 according to the second embodiment of the present invention. The phase difference adjusting unit 21, according to the second embodiment, causes a Soleil compensator to adjust the phase difference. The Soleil compensator is introduced in FIG. 1 at element 118, on page 84 of the above-described "How to Use Optical Components and Points to Be Noted for Optronics Application: Enlarged and Revised Edition".

FIG. 17 is a view when a Soleil compensator (Babinet-Soleil compensator) is seen from a side. The Soleil compensator includes two wedges (phase difference adjusting elements) 21c and 21d made of a uniaxial crystal, and an actuator for driving the wedge 21d. The directions of the optical axes of the two uniaxial crystals are almost parallel to each other. When one wedge is relatively driven in the direction (a direction perpendicular to the optical axis) of the tip of the other edge to change the relative positional relationship between the two wedges, the total thickness of the uniaxial crystals of the two wedges in the optical axis direction changes. This makes it possible to continuously change the birefringence amount of the entire Soleil compensator.

The polarization direction of light, which strikes the Soleil compensator, is set in the optical axis direction of the uniaxial crystal or in a direction perpendicular to the optical axis of the uniaxial crystal. As the wedge relatively moves, the birefringence amount of the Soleil compensator changes. This makes it possible to continuously generate a phase difference in the two perpendicular directions.

Note that a high degree of being parallel between the two wedges 21c and 21d must be strictly ensured to manufacture a Soleil compensator. That is, a low degree of being parallel between the two wedges changes the thickness of the uniaxial crystal in the optical axis direction in accordance with the place of the Soleil compensator. This results in a variation in phase difference within the effective diameter of the Soleil compensator. Hence, the method of inclining a phase difference adjusting plate made of a uniaxial crystal, as in the first embodiment, is more advantageous in consideration of operability, including workability.

The phase difference adjusting unit 21 preferably comprises an actuator for driving a phase difference adjusting element (phase difference adjusting plate or wedge), as described above. In addition, the actuator preferably drives the phase difference adjusting element in accordance with the allowable CD uniformity of a pattern to be exposed for each illumination mode and polarization state. For example, the actuator can drive, i.e., adjust the phase difference of the phase difference adjusting element at an arbitrary timing, periodically, cyclically, or in accordance with a predetermined schedule.

Figure 18:
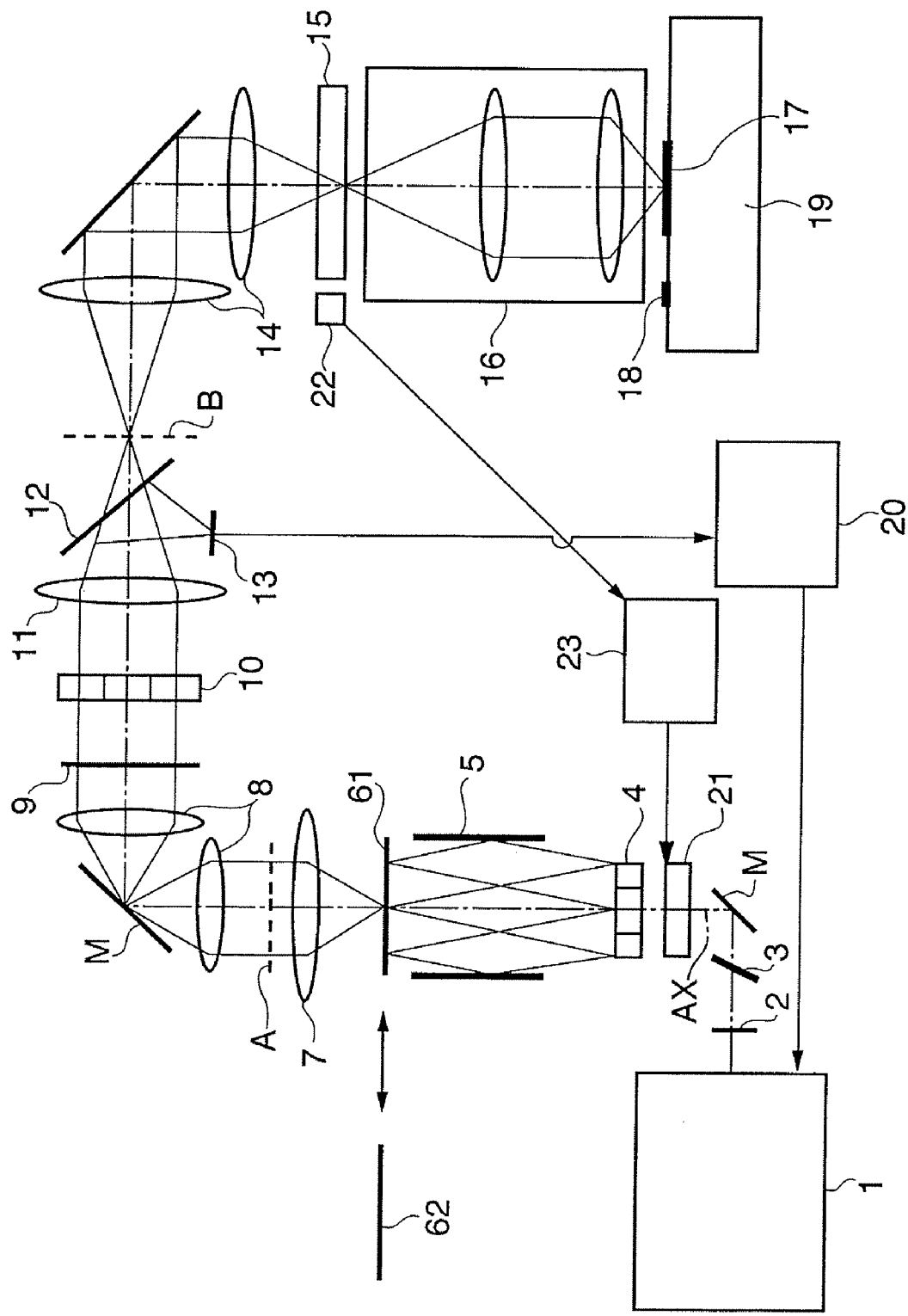
FIG. 18 is a view showing a schematic arrangement of an exposure apparatus according to another preferred embodiment of the present invention.

As illustrated in FIG. 18, the actuator may drive the phase difference adjusting element of the phase difference adjusting unit 21 so that the phase difference falls within the target range, in accordance with a measurement result obtained by a measurement unit 22 for measuring the polarization state on the object plane of the projection optical system.

A phase difference control unit 23 drives an actuator 21b or 21e so that the phase difference at the position of a mask 15 (the object plane of the projection optical system) falls within the target range, in accordance with a measurement result obtained by the measurement unit 22. With this arrangement, the phase difference adjusting unit 21 can be driven based on the measurement results of the phase difference on the object plane of the projection optical system, so that the phase difference falls within a predetermined allowable value. This makes it possible to reduce a variation in the degree of polarization between image heights due to birefringence of the projection optical system and, even to enhance the CD uniformity.

Figure 19:
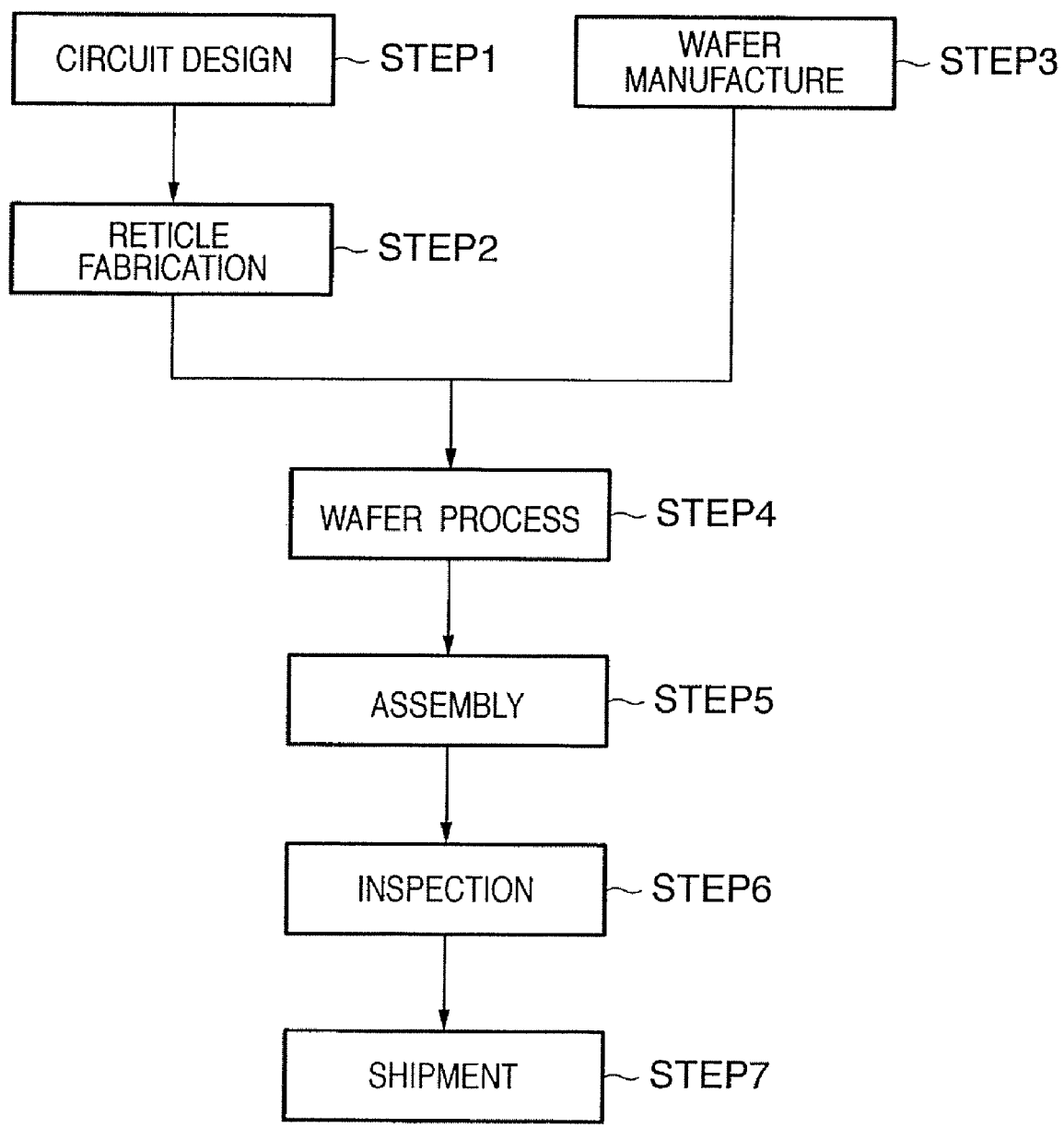
FIG. 19 is a flowchart illustrating the sequence of the overall semiconductor device manufacturing method.

A device manufacturing method using the above-described exposure apparatus will be described next. FIG. 19 is a flowchart illustrating the sequence of the overall semiconductor device manufacturing method. In step 1 (circuit design), the circuit of a semiconductor device is designed. In step 2 (reticle fabrication), a reticle (also called a mask) is fabricated on the basis of the designed circuit pattern. In step 3 (wafer manufacture), a wafer (also called a substrate) is manufactured using a material such as silicon. In step 4 (wafer process), called a pre-process, an actual circuit is formed on the wafer by lithography using the reticle and wafer. In step 5 (assembly), called a post-process, a semiconductor chip is formed using the wafer manufactured in step 4. This step includes processes such as assembly (dicing and bonding) and packaging (chip encapsulation). In step 6 (inspection), inspections including an operation check test and a durability test of the semiconductor device manufactured in step 5 are performed. A semiconductor device is completed with these processes and shipped, in step 7.

Figure 20:
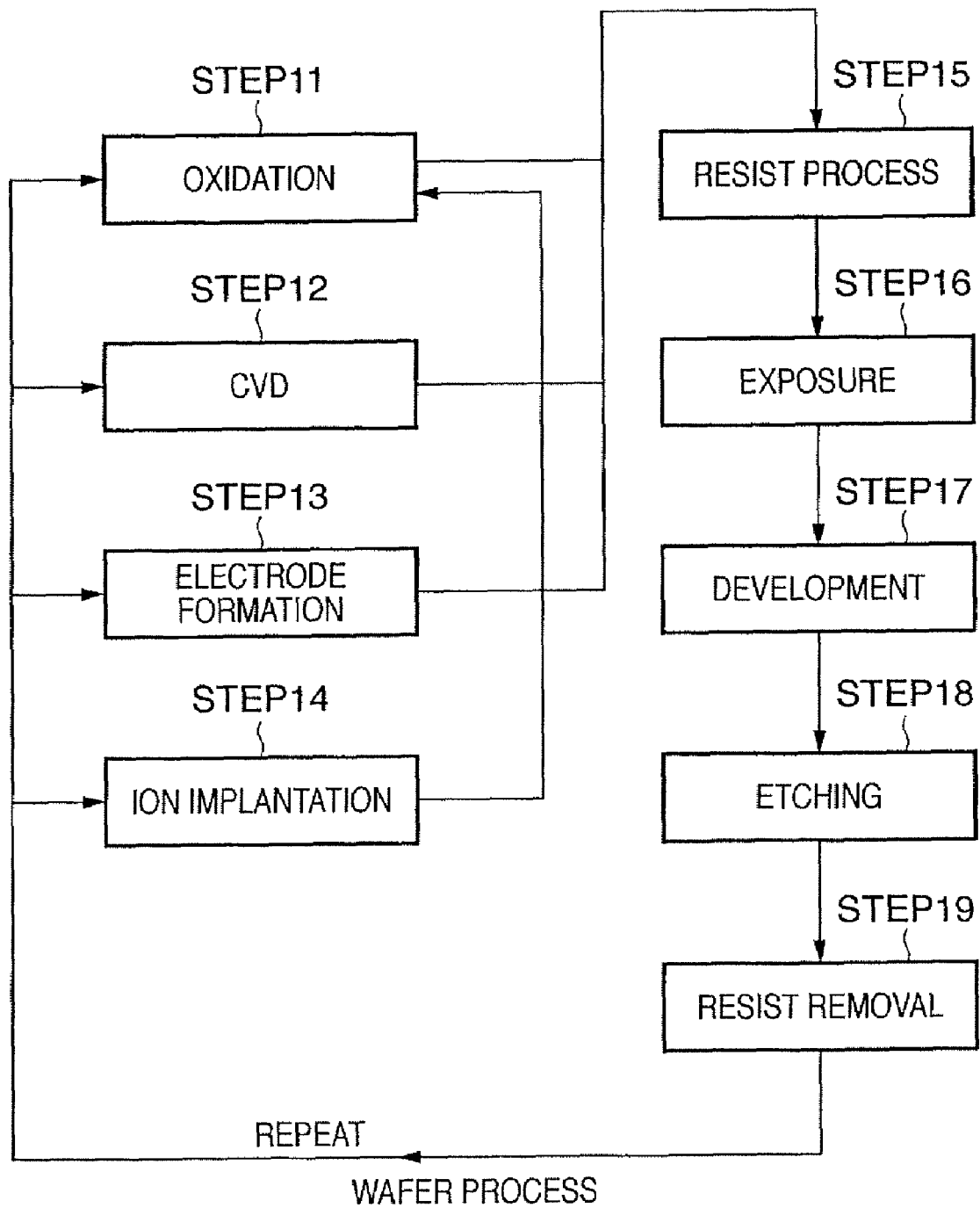
FIG. 20 is a flowchart illustrating the detailed sequence of the wafer process.

FIG. 20 is a flowchart illustrating the detailed sequence of the wafer process. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a resist is applied to the wafer. In step 16 (exposure), the above-described exposure apparatus is used to expose the wafer coated with the photosensitive agent via the mask on which the circuit pattern is formed, to form a latent image pattern on the resist. In step 17 (development), the resist transferred onto the wafer is developed to form a resist pattern. In step 18 (etching), the layer or substrate under the resist pattern is etched through a portion where the resist pattern opens. In step 19 (resist removal), any unnecessary resist remaining after etching is removed. By repeating these steps, a multilayered structure of circuit patterns is formed on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus which exposes a substrate to light, said apparatus comprising:
an illumination optical system which illuminates a mask with illumination light, the illumination light containing a primary component of polarized light and a secondary component of the polarized light, which are perpendicular to each other, and said illumination optical system including a phase difference adjusting unit configured to adjust a phase difference between the primary component of the polarized light and the secondary component of the polarized light without changing a direction of the primary component of the polarized light; and
a projection optical system which projects a pattern of the mask onto the substrate,
wherein said phase difference adjusting unit includes a phase difference adjusting plate made of a uniaxial crystal, and an actuator which rotates said phase difference adjusting plate about an axis perpendicular to the optical axis of said illumination optical system.

2. An exposure apparatus which exposes a substrate to light, said apparatus comprising:
an illumination optical system which illuminates a mask with illumination light, the illumination light containing a primary component of polarized light and a secondary component of the polarized light, which are perpendicular to each other, and said illumination optical system including a phase difference adjusting unit configured to adjust a phase difference between the primary component of the polarized light and the secondary component of the polarized light without changing a direction of the primary component of the polarized light; and
a projection optical system which projects a pattern of the mask onto the substrate,
wherein said phase difference adjusting unit includes a Soleil compensator that includes two wedges, and an actuator which changes a total thickness of said two wedges in an optical axis direction of said illumination optical system.

3. An exposure apparatus which exposes a substrate to light, said apparatus comprising:
an illumination optical system which illuminates a mask with illumination light, the illumination light containing a primary component of polarized light and a secondary component of the polarized light, which are perpendicular to each other, and said illumination optical system including a phase difference adjusting unit configured to adjust a phase difference between the primary component of the polarized light and the secondary component of the polarized light without changing a direction of the primary component of the polarized light; and
a projection optical system which projects a pattern of the mask onto the substrate,
wherein letting Im be a light amount of the primary component of the polarized light as the illumination light, Is be a light amount of the secondary component of the polarized light as the illumination light, $\phi$ be a phase difference between the primary component of the polarized light and the secondary component of the polarized light on an object plane of said projection optical system, $\theta$ be a retardation amount of said projection optical system, and RoP be (Im/(Im+Is)), the following equation is satisfied:

$$|\sin\phi| \le \frac{0.02}{|\sin\theta|\sqrt{RoP - RoP^2}}.$$

* * * * *